(12) United States Patent
Hashimoto et al.

(10) Patent No.: US 7,271,422 B2
(45) Date of Patent: Sep. 18, 2007

(54) SEMICONDUCTOR OPTICAL DEVICE

(75) Inventors: Jun-ichi Hashimoto, Yokohama (JP); Tsukuru Katsuyama, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 205 days.

(21) Appl. No.: 11/210,110

(22) Filed: Aug. 24, 2005

(65) Prior Publication Data
US 2006/0043408 A1   Mar. 2, 2006

(30) Foreign Application Priority Data
Aug. 27, 2004   (JP)   ............ P2004-248946

(51) Int. Cl.
*H01L 33/00* (2006.01)
(52) U.S. Cl. ............ 257/96; 257/94; 257/E21.188; 438/47
(58) Field of Classification Search ............ 257/13, 257/76, 94, 96; 438/46, 47
See application file for complete search history.

(56) References Cited

U.S. PATENT DOCUMENTS
6,984,850 B2 * 1/2006 Nakatsu et al. ............ 257/94

FOREIGN PATENT DOCUMENTS
JP   03-020724   1/1991

OTHER PUBLICATIONS

Ronald J. Nelson, et al., "CW Electrooptical Properties of InGaAsP ($\lambda$=1.3 $\mu$m) Buried-Heterostructure Lasers", IEEE Journal of Quantum Electronics, vol. QE-17, No. 2, Feb. 1981.

Julian S. Osinski, et al., "Threshold Current Analysis of Compressive Strain (0-18%) in Low-Threshold, Long-Wavelength Quantum Well Lasers", IEEE Journal of Quantum Electronics, vol. 29, No. 6, Jun. 1993.

* cited by examiner

*Primary Examiner*—Quoc Hoang
(74) *Attorney, Agent, or Firm*—Smith, Gambrell & Russell, LLP

(57) ABSTRACT

In a semiconductor optical device, a first conductive type semiconductor region includes first and second semiconductor portions. The first and second semiconductor portions are made of nitride mixed semiconductor crystal. This first semiconductor portion has a first region and a second region. The second semiconductor portion is provided on the first region of the first semiconductor portion. A second conductive type semiconductor region is made of nitride mixed semiconductor crystal. The second conductive type semiconductor region includes a first region and a second region. This second region of the first semiconductor portion of the first conductive type semiconductor region and the second region of the second conductive type semiconductor region constitute a pn junction. The sides of the second semiconductor portion of the first conductive type semiconductor region and the second region of the second conductive type semiconductor region constitute a pn junction. An active layer is made of nitride mixed semiconductor crystal the active layer is provided between the second semiconductor portion of the first conductive type semiconductor region and the first region of the second conductive type semiconductor region. The bandgap energies of the first conductive type semiconductor region and the second conductive type semiconductor region are greater than that of the active layer.

16 Claims, 15 Drawing Sheets

Fig.2
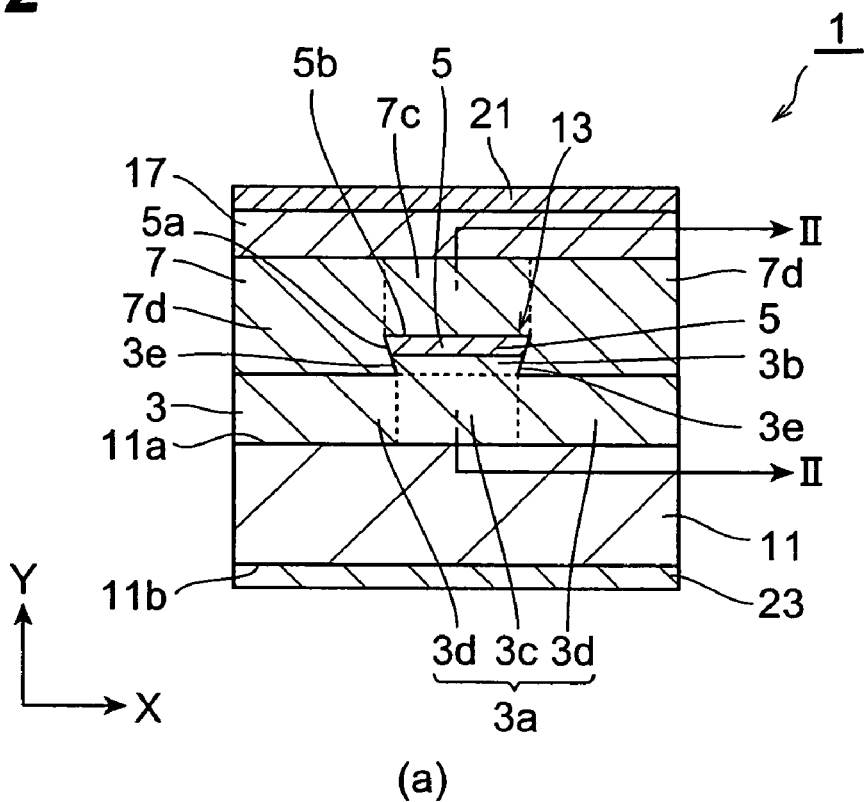
(a)
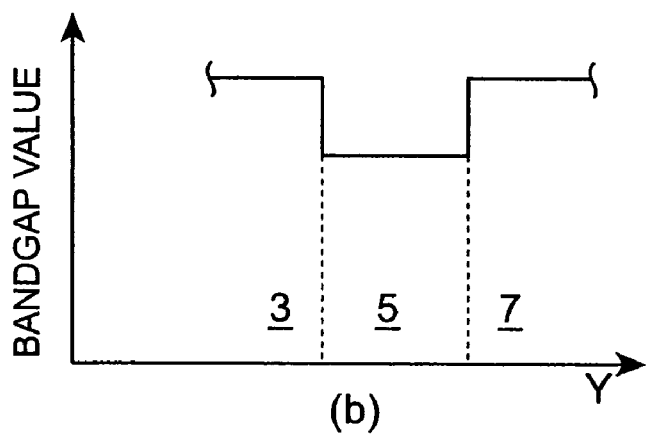
(b)
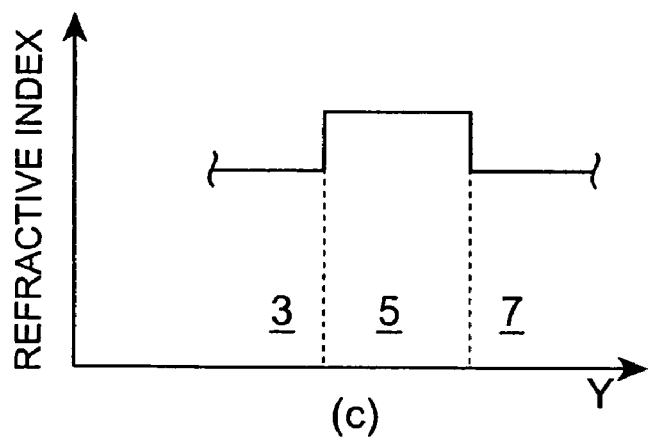
(c)

Fig.4
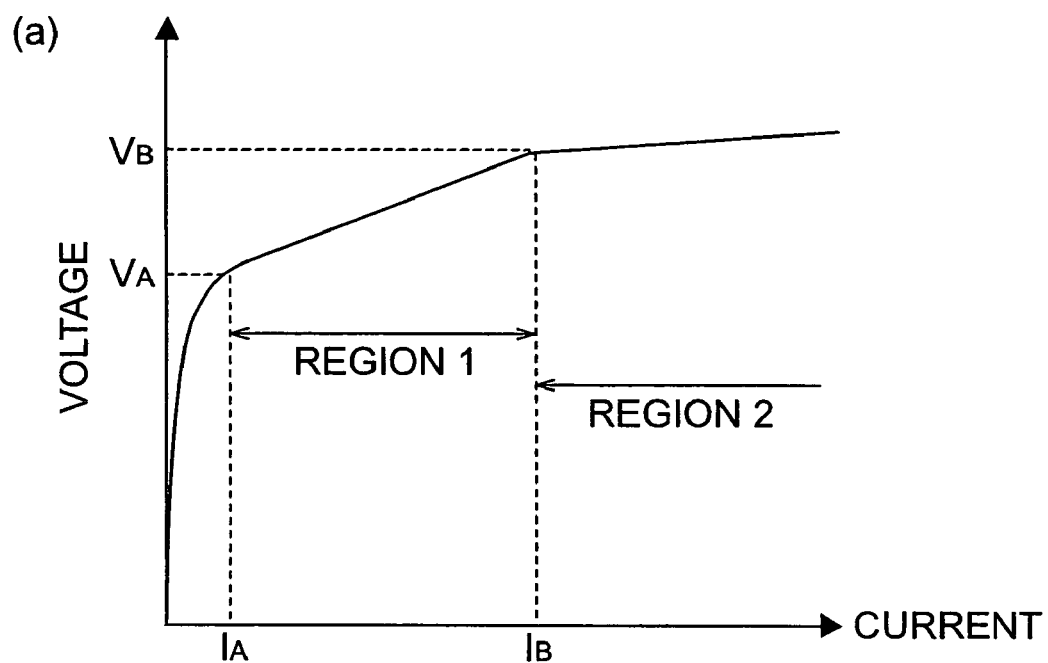
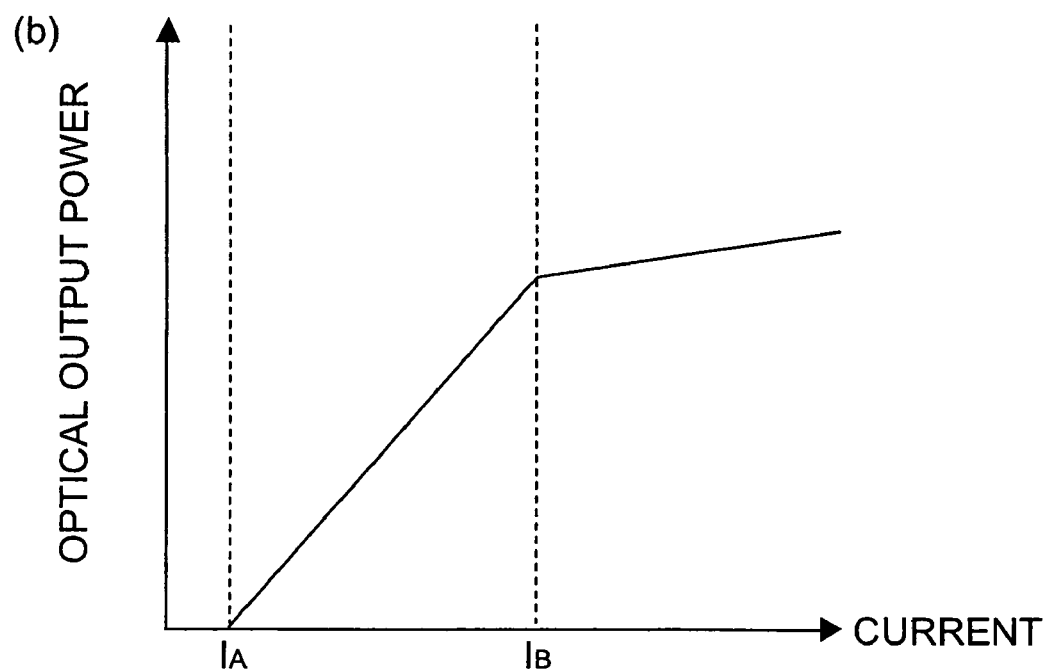

Fig.7
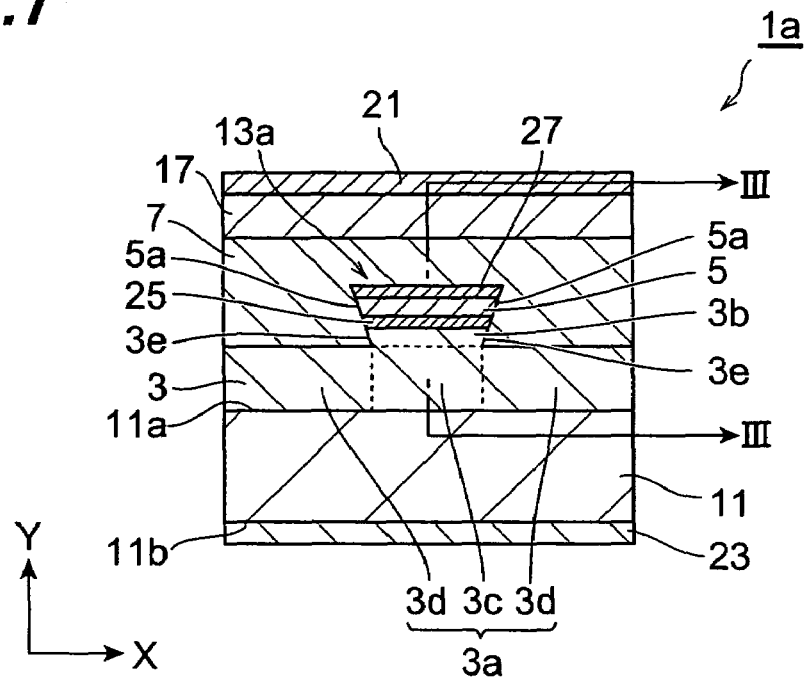
(a)
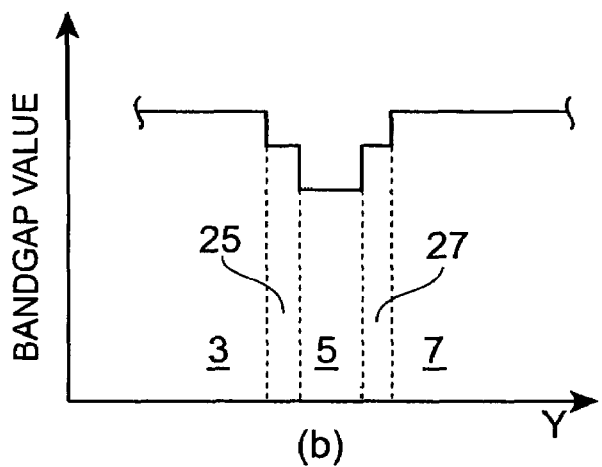
(b)
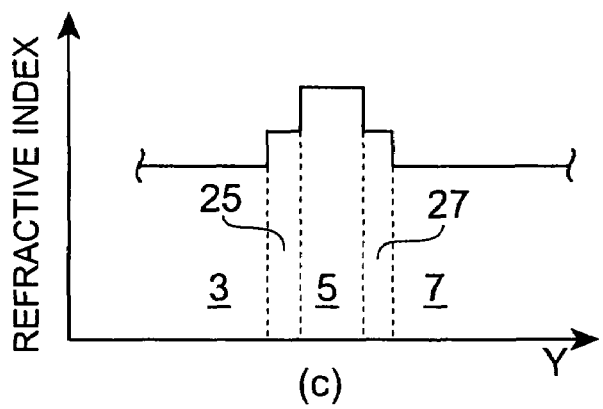
(c)

Fig.9
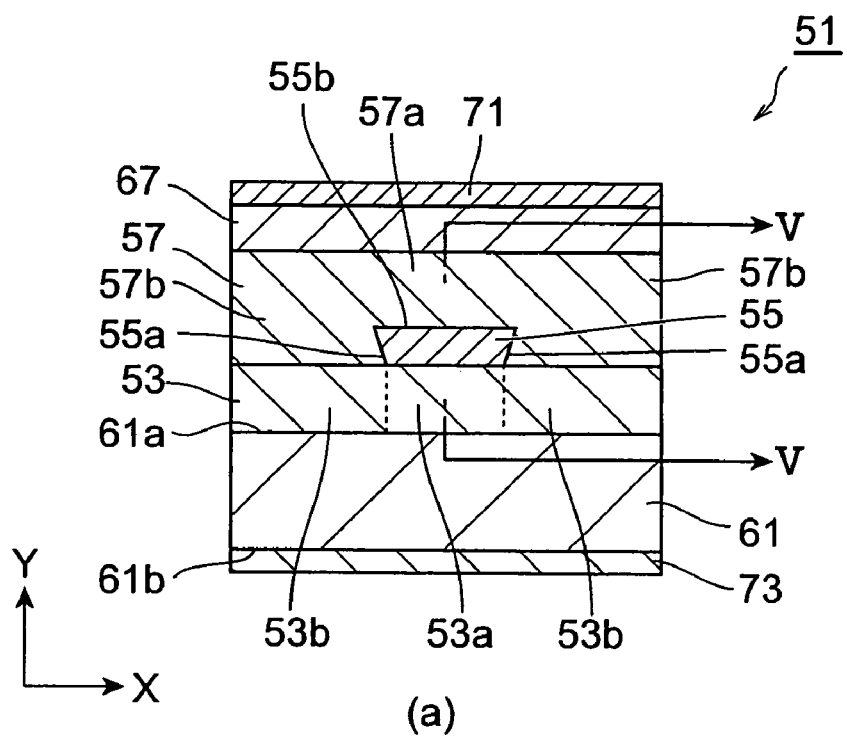
(a)
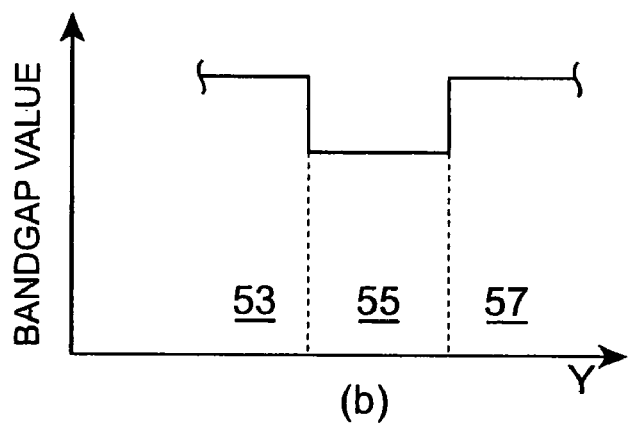
(b)
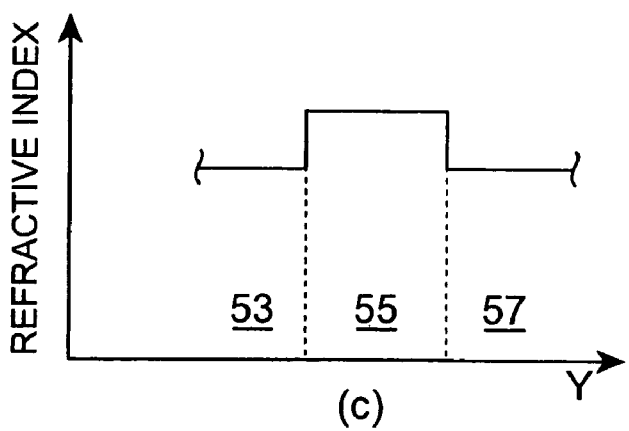
(c)

*Fig.10*

| COMPONENT | MATERIAL |
|---|---|
| SUBSTRATE OR BASE LAYER | GaN, SiC, Si, ZrB$_2$ Al$_2$O$_3$, AlN, ZnO, MgAl$_2$O$_4$ |
| FIRST CONDUCTIVE TYPE SEMICONDUCTOR REGION | AlGaN |
| ACTIVE REGION | AlGaN, InGaN, GaN, InN |
| SECOND CONDUCTIVE TYPE SEMICONDUCTOR REGION | AlGaN |
| OPTICAL CONFINEMENT LAYER | AlGaN, InGaN, GaN |
| CONTACT LAYER | GaN, InGaN |

Fig.11
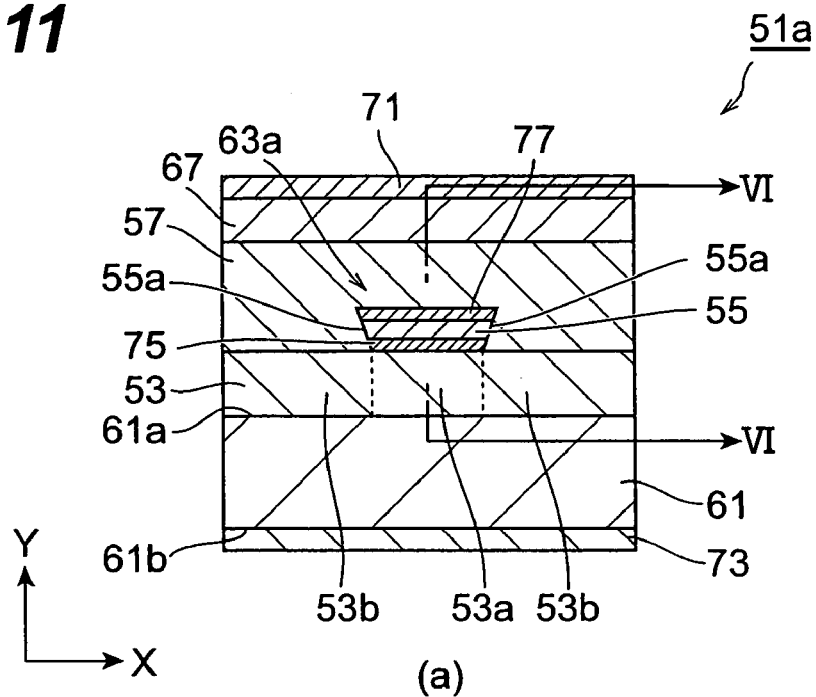
(a)
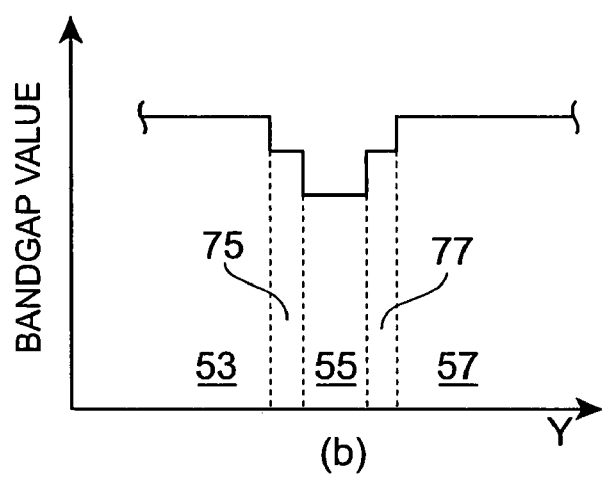
(b)
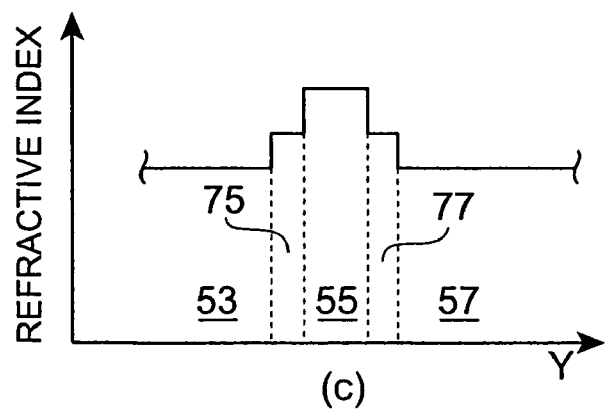
(c)

*Fig.13*
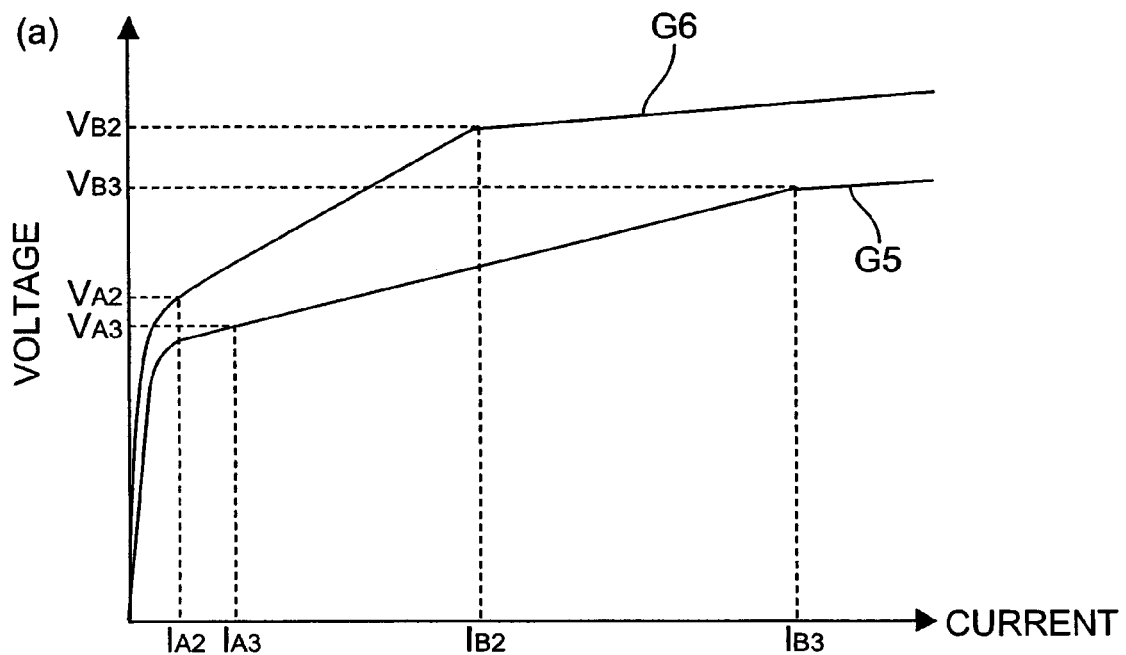
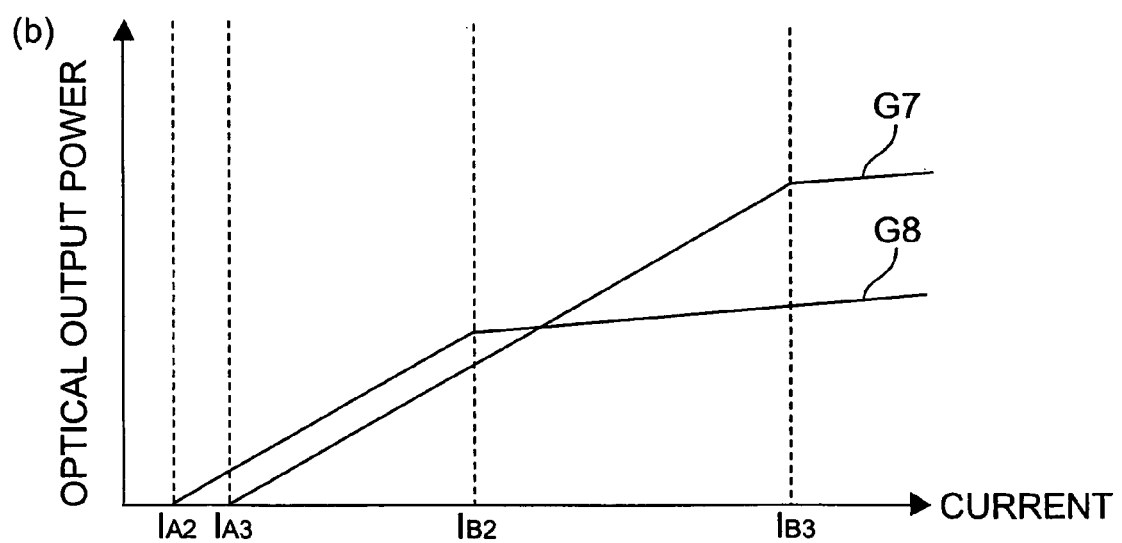

Fig.14
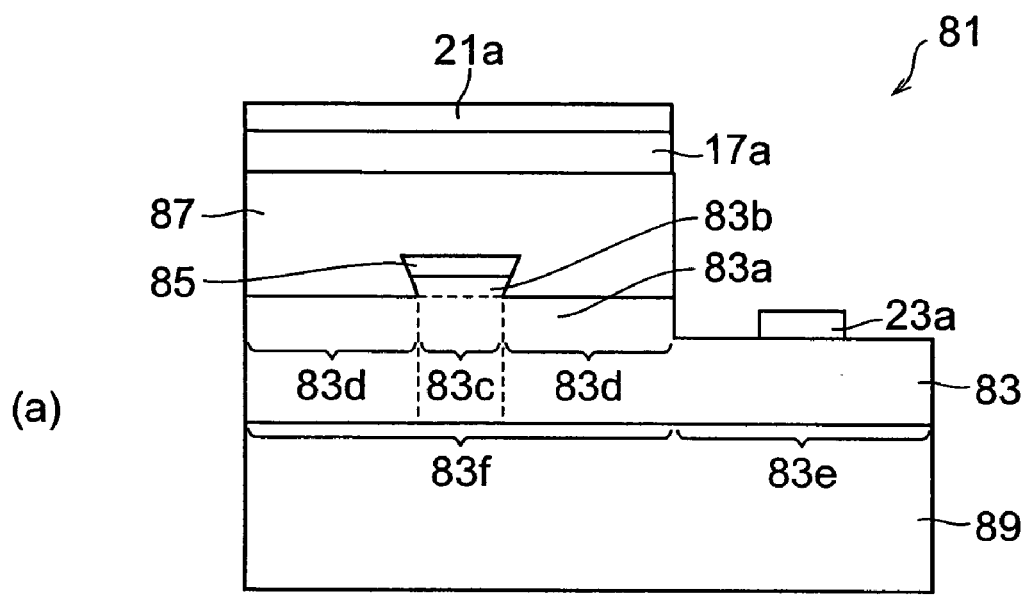
(a)
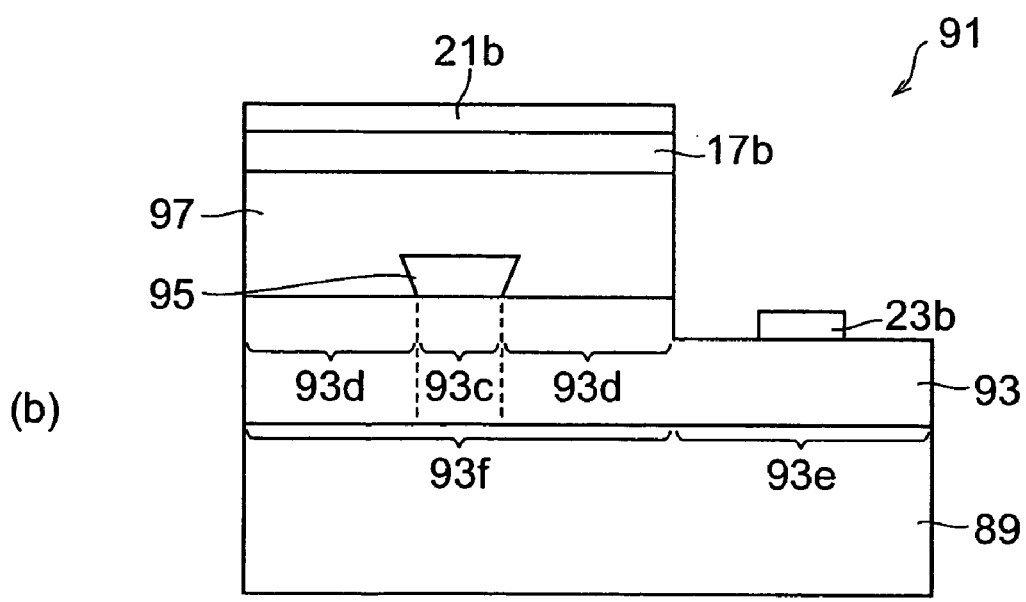
(b)

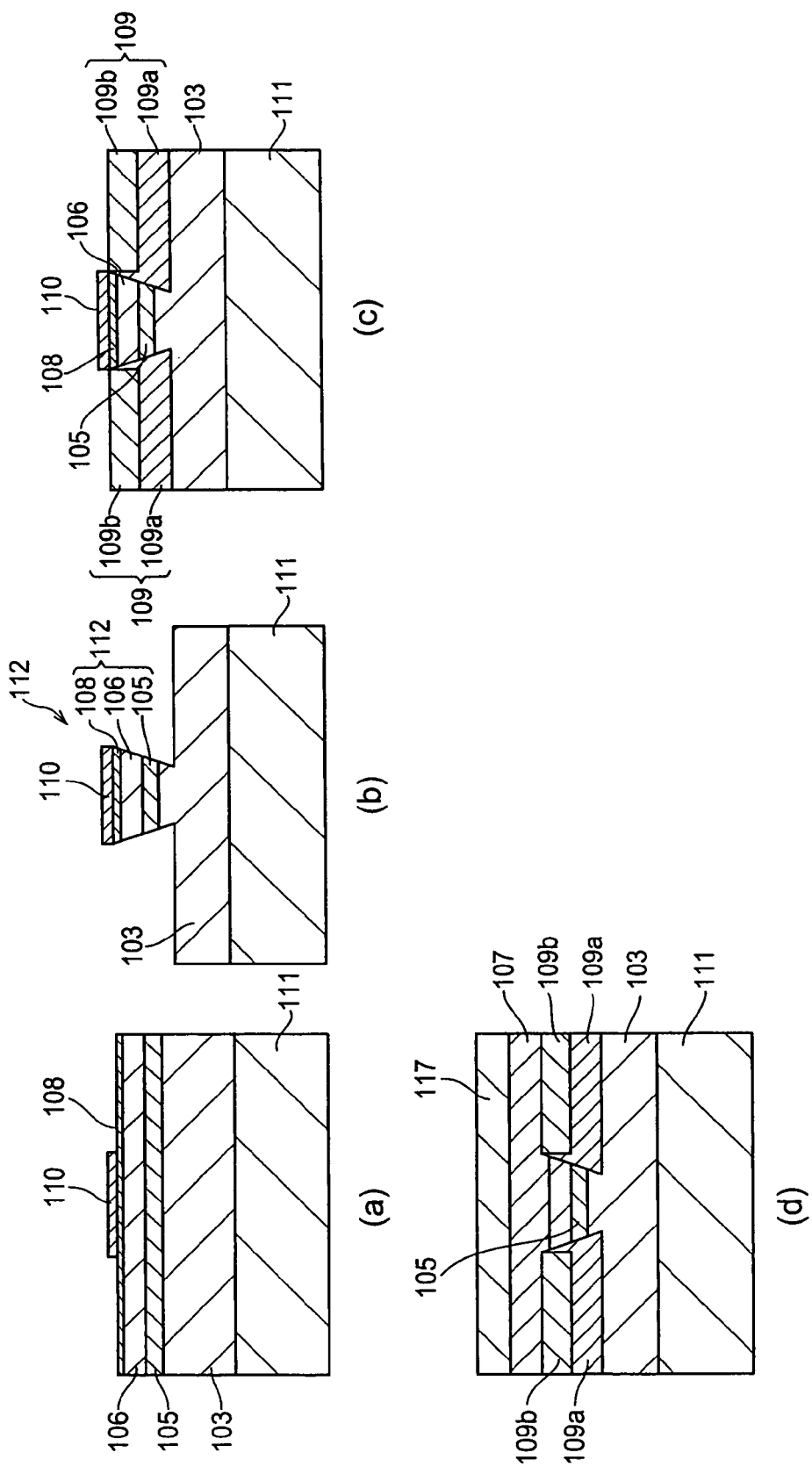

SEMICONDUCTOR OPTICAL DEVICE

BACKGROUND OF THE INVENTION

1. Field of the Invention

The present invention relates to a semiconductor optical device.

2. Related Background of the Invention

Publication 1 (IEEE JOURNAL OF QUANTUM ELECTRONICS, VOL.QE-17, NO.2, FEBRUARY 1981, pp. 202-207) discloses a buried hetero-structure semiconductor laser. This semiconductor laser has an active layer made of GaInAsP semiconductor. This active layer is provided between a p-type InP semiconductor layer and an n-type InP semiconductor layer and is located between InP current block portions of InP semiconductor. Carriers are injected into the active layer and the injected carriers are confined into the active layer by the hetero-barriers at the interfaces between the active layer and the current block portions.

SUMMARY OF THE INVENTION

FIG. 15 shows a method of manufacturing a buried hetero-structure semiconductor laser as described above. As shown in area (a) in FIG. 15, an n-type InP semiconductor layer (n-type cladding layer) 103, a GInaAsP active layer 105, a p-type InP semiconductor layer (p-type cladding layer) 106, a protecting layer 108 are epitaxially grown on an InP substrate 111. A mask 110 for forming a waveguide structure is formed on the protecting layer 108. Material of the mask layer is usually insulator, such as $SiO_2$, SiN and so on. Then, as shown in area (b) in FIG. 15, the protecting layer 108, p-type InP semiconductor layer 106, GaIAsP active layer 105 and n-type InP semiconductor layer 103 are etched using the mask 110 to form a mesa 112 for the waveguide structure.

Then, as shown in area (c) in FIG. 15, a current block portion 109 having a p-type semiconductor layer 109a and an n-type semiconductor layer 109b is epitaxially grown on both sides of the mesa 112. Since the mask 110 is located on the top of the mesa 112 including the active layer, the current block portion 109 is not formed on the mesa 112. Next, as shown in area (d) in FIG. 15, the protecting layer 108 and the mask 110 are removed and a p-type InP semiconductor layer 107 (p-type cladding layer) and a p-type GaInAsP semiconductor layer (p-type contact layer) 117 are epitaxially grown thereon. An anode electrode and a cathode electrode are formed on the p-type semiconductor layer 117 and the InP substrate 111, respectively, to form the buried heterostructure semiconductor laser.

In the fabrication of buried heterostructure semiconductor blue-light lasers by use of nitride mixed semiconductor crystal, such as AlGaN, GaN and InGaN, it is not easy to fabricate the buried heterostructure semiconductor blue lasers using the method in FIG. 15 because of the following reasons. That is, the above nitride mixed semiconductor crystal has to be grown at the high temperature of about 1000 Celsius degrees or higher in order to obtain a good crystalline quality. Because of the large difference between the thermal expansion coefficients of the base nitride mixed semiconductor and that of the insulator mask located thereon, the insulator mask may suffer large thermal stress from the base nitride mixed semiconductor in such a high temperature growth of the current block portion, resulting in the peeling off of the mask insulator. Consequently, since the regrowth step using an insulator mask shown in area (c) of FIG. 15 cannot be used to form the current block portion of this laser, it is not easy to fabricate buried heterostructure semiconductor blue-light lasers by use of the above method, thereby decreasing the yield of buried heterostructure semiconductor blue-light lasers. Accordingly, in the past, a ridge type structure did not need a regrowth step of the current block portion had been used exclusively for the blue-light semiconductor lasers.

It is an object of the present invention to provide a semiconductor optical device that permits the formation of the buried hetero-structure without using an insulator mask.

According to one aspect of the present invention, a semiconductor optical device comprises a first conductive type semiconductor region, a second conductive type semiconductor region and an active layer. The first conductive type semiconductor region includes a first semiconductor portion and a second semiconductor portion. The first and second semiconductor portions are made of nitride mixed semiconductor crystal. The first semiconductor portion has a first region and a second region. The first and second regions are arranged along a predetermined plane. The second semiconductor portion is provided on the first region of the first semiconductor portion. The second semiconductor portion has a side. The second conductive type semiconductor region is made of nitride mixed semiconductor crystal. The second conductive type semiconductor region includes a first region and a second region. The first region is different from the second region. The second region of the first semiconductor portion of the first conductive type semiconductor region and the second region of the second conductive type semiconductor region constitute a pn junction. The sides of the second semiconductor portion and the second region of the second conductive type semiconductor region constitute a pn junction. The active layer is made of nitride mixed semiconductor crystal. The active layer is provided between the second semiconductor portions of the first conductive type semiconductor region and the first region of the second conductive type semiconductor region. The bandgap energy of the first conductive type semiconductor region is greater than that of the active layer. The bandgap energy of the second conductive type semiconductor region is greater than that of the active layer.

According to another aspect of the present invention, a semiconductor optical device comprises a first conductive type semiconductor region, a second conductive type semiconductor region and an active layer. The first conductive type semiconductor region has a first region and a second region, the first conductive type semiconductor region being made of nitride mixed semiconductor crystal. The first and second regions are arranged along a predetermined plane. The second conductive type semiconductor region includes a first region and a second region. The second conductive type semiconductor region is made of nitride mixed semiconductor crystal. The first region is different from the second region. The second region of the second conductive type semiconductor region and the second region of the first conductive type semiconductor region constitute a pn junction. The active layer is provided between the first region of the first conductive type semiconductor region and the first region of the second conductive type semiconductor region. The active layer is made of nitride mixed semiconductor crystal. The bandgap energy of the first conductive type semiconductor region is greater than that of the active layer. The bandgap energy of the second conductive type semiconductor region is greater than that of the active layer.

According to the present invention, the semiconductor optical device further comprises a substrate having a surface. The first conductive type semiconductor region, the second conductive type semiconductor region and the active layer are grown on the surface of the substrate. The surface of the substrate is made of one of GaN, SiC, $Al_2O_3$, Si, AlN, ZnO, $MgAl_2O_4$, and $ZrB_2$.

In the semiconductor optical device according to the present invention, the first conductive type semiconductor region is made of $Al_XGa_{1-X}N$ semiconductor (0<X<1), the second conductive type semiconductor region is made of $Al_YGa_{1-Y}N$ semiconductor (0<Y<1), and the active layer is made of at least one of $In_ZGa_{1-Z}N$ semiconductor (0<Z<1), $Al_SGa_{1-S}N$ semiconductor (0<S<1), GaN semiconductor and InN semiconductor.

According to the present invention, the semiconductor optical device further comprises a second conductive type contact layer provided on the active layer and the second conductive type semiconductor region. The second conductive type contact layer is made of nitride mixed semiconductor.

In the semiconductor optical device according to the present invention, the first conductive type semiconductor region includes a third region and a fourth region. The third region and the second conductive type semiconductor region constitute the pn junction, and a dopant concentration of the third region is different from that of the fourth region.

In the semiconductor optical device according to the present invention, the second conductive type semiconductor region includes a third region and a fourth region. The third region and the first conductive type semiconductor region constitute the pn junction, and a dopant concentration of the third region is different from that of the fourth region.

According to the present invention, the semiconductor optical device further comprises a first optical confinement layer provided between the active layer and the first conductive type semiconductor region, and a second optical confinement layer provided between the active layer and the second conductive type semiconductor region.

In the semiconductor optical device according to the present invention, the semiconductor optical device includes a semiconductor laser.

In the semiconductor optical device according to the present invention, the semiconductor optical device includes a light emitting diode.

In the semiconductor optical device according to the present invention, the semiconductor optical device includes a semiconductor optical amplifier.

In the semiconductor optical device according to the present invention, the semiconductor optical device includes an electro-absorption type modulator.

In the semiconductor optical device according to the present invention, the semiconductor optical device includes a semiconductor optical waveguide.

In the semiconductor optical device according to the present invention, the semiconductor optical device includes an integrated optical device having at least one of a semiconductor laser, a light emitting diode, a semiconductor optical amplifier, an electro-absorption type modulator and a semiconductor optical waveguide.

BRIEF DESCRIPTION OF THE DRAWINGS

The above-described object and other objects, features, and advantages of the present invention will become apparent more easily in the detailed description of the preferred embodiments of the present invention which will be described below with reference to the accompanying drawings.

FIG. 2 is a view showing the semiconductor optical device according to the first embodiment.

FIG. 4 schematically shows current vs. voltage and current vs. optical output power characteristics for the semiconductor optical device according to the first embodiment.

FIG. 7 is a view showing a modified semiconductor optical device according to the first embodiment.

FIG. 9 is a view for the semiconductor optical device according to the second embodiment.

FIG. 10 is a view showing the list of the combination of the semiconductor material that can be used for the semiconductor optical device of this invention.

FIG. 11 is a view showing another modified semiconductor optical device.

FIG. 13 schematically shows current vs. voltage and current vs. optical output power characteristics for the semiconductor optical device.

FIG. 14 is a view showing a semiconductor optical device according to the third embodiment.

FIG. 15 is a view showing an example of the steps for fabricating a buried heterostructure semiconductor laser.

DESCRIPTION OF THE PREFERRED EMBODIMENTS

The teachings of the present invention will readily be understood in view of the following detailed description with reference to the accompanying drawings illustrated by way of example. When possible, parts identical to each other will be referred to with reference symbols identical to each other.

(First Embodiment)

Figure 1:
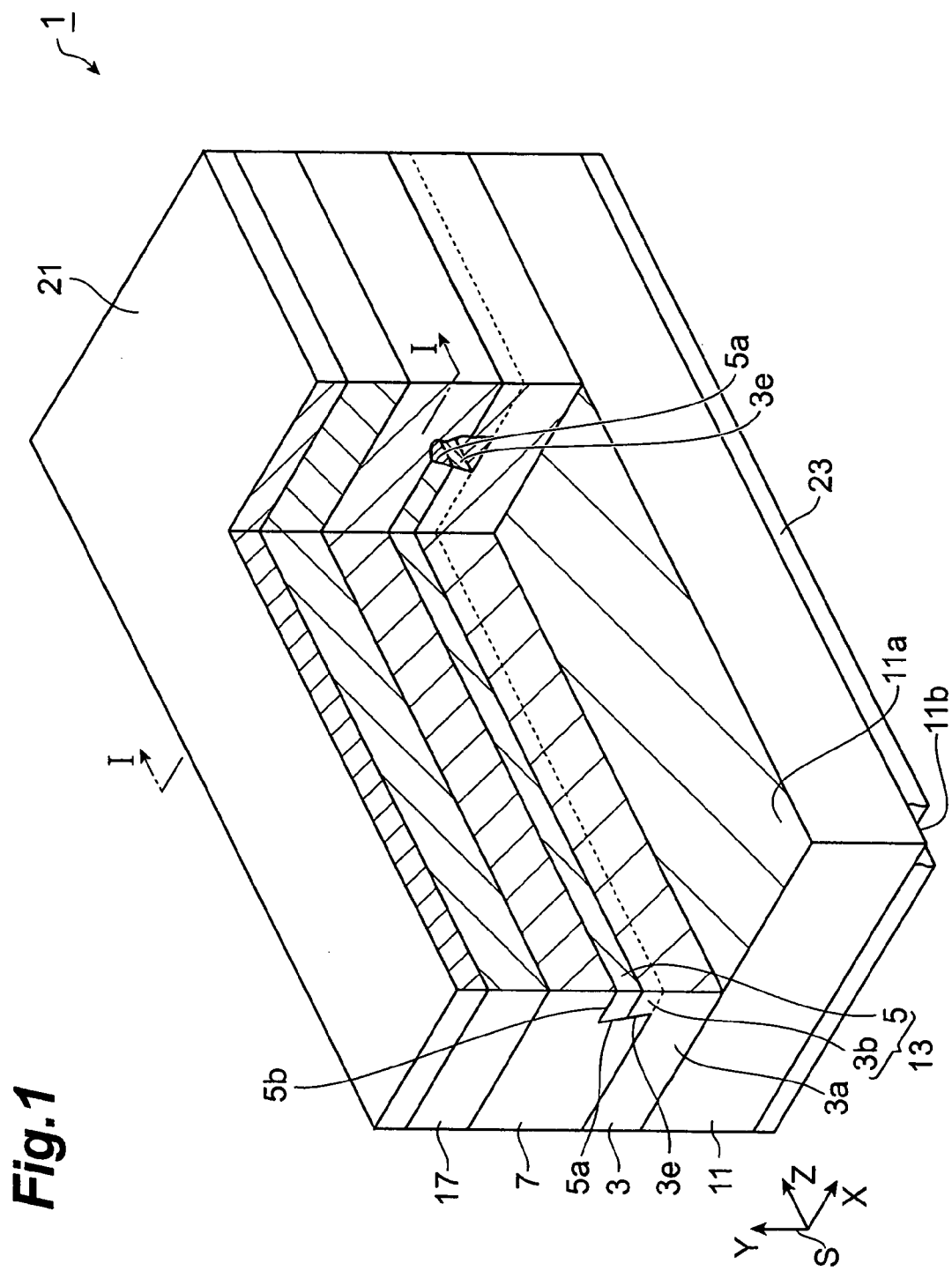
FIG. 1 is a perspective view showing a semiconductor optical device according to the first embodiment.

FIG. 1 is a perspective view showing a semiconductor optical device according to the first embodiment. An XYZ coordinate system S is depicted in FIG. 1. FIG. 2 is a view showing the semiconductor optical device according to the first embodiment. Area (a) in FIG. 2 shows a cross sectional view taken along I-I in FIG. 1. Area (b) in FIG. 2 shows a band diagram, taken along II-II in area (a), for the semiconductor optical device according to the first embodiment. Area (c) in FIG. 2 shows a refractive index diagram, taken along II-II in area (a), for the semiconductor optical device according to the first embodiment.

FIGS. 1 and 2 shows a semiconductor optical device 1, such as a semiconductor laser. The semiconductor optical device 1 comprises a first conductive type semiconductor region 3, an active layer 5, and a second conductive type semiconductor region 7. The first conductive type semiconductor region 3 has first and second semiconductor portions 3a and 3b. As shown in area (a) of FIG. 2, the first semiconductor portion 3a includes a first region 3c and a second region 3d arranged along the surface 11a of the substrate 11. The second semiconductor portions 3b is located on the first region 3c of the first semiconductor portion 3a. The second semiconductor portion 3b extends in the direction of the z-axis and the second semiconductor portion 3b has a pair of sides 3e. The conductive type of the semiconductor region 7 is different from that of the semiconductor region 3, and it has the first region 7c and the second region 7d which are arranged along a predetermined plane. The active layer 5 is provided on the second semiconductor portion 3b of the first conductive type semiconductor region 3. The active layer 5 has a pair of sides 5a. The second conductive type semiconductor region 7 is provided on the second region 3d of the first semiconductor portion 3a of the first conductive type semiconductor region 3, the sides 3e of the second semiconductor portion 3b, and the sides 5a and the top 5b of the active layer 5. The second region 7d of the second conductive type semiconductor region 7 and the second region 3d of the first semiconductor portion 3a of the first conductive type semiconductor region 3 form a pn junction, and the second region 7d of the second conductive type semiconductor region 7 and the sides 3e of the second semiconductor portion 3b form a pn junction. The active layer 5 is located between the second semiconductor portion 3b of the first conductive type semiconductor region 3 and the first region 7c of the second conductive type semiconductor region 7.

The first conductive type semiconductor region 3 is made of III-V nitride mixed semiconductor, the bandgap of which is greater than that of the active layer 5 which is also made of III-V nitride mixed semiconductor. In other words, the photoluminescence wavelength of III-V nitride mixed semiconductor of the first conductive type semiconductor region 3 is shorter than that of the active layer 5. The second conductive type semiconductor region 7 is made of III-V nitride mixed semiconductor, the bandgap of which is greater than that of the active layer 5. In other words, the photoluminescence wavelength of III-V nitride mixed semiconductor of the second conductive type semiconductor region 7 is shorter than that of the active layer 5. A photoluminescence wavelength of semiconductor material is equal to the wavelength that corresponds to the bandgap thereof. As seen from the bandgap diagram shown in area (b) of FIG. 2, the first conductive type semiconductor region 3 and the second conductive type semiconductor region 7 confine carriers to the active layer 5. Consequently, the first conductive type semiconductor region 3 works as a cladding layer of the first conductive type and the second conductive type semiconductor region 7 works as a cladding layer of the second conductive type. In the active layer 5, the confined carriers injected from the first conductive type semiconductor region 3 and the second conductive type semiconductor region 7 are recombined to generate light. III-V nitride mixed semiconductor containing at least one of gallium, indium and aluminum can be used as the above III-V nitride mixed semiconductor.

As shown in the refractive index diagram of area (c) of FIG. 2, the refractive index of the first conductive type semiconductor region 3 is smaller than that of active layer 5. The refractive index of the second conductive type semiconductor region 7 is also smaller than that of active layer 5. Accordingly, the first conductive type semiconductor region 3 and the second conductive type semiconductor region 7 confine light from the active layer 5 in the active layer 5 in both x and y directions. Consequently, the first conductive type semiconductor region 3 and the second conductive type semiconductor region 7 act as optical cladding layers.

The structure of the active layer 5 may be the bulk structure of a single layer, the single quantum well structure of a single quantum well layer or the multiple quantum well structure of a plurality of well layers and barrier layers which are alternately arranged.

The semiconductor optical device 1 further comprises a semiconductor substrate 11. For example, conductive substrates can be used as the semiconductor substrate 11 and examples of the substrates are as follows: GaN, SiC, Si, AlN, ZnO and $ZrB_2$. The first conductive type semiconductor region 3 is provided on the primary surface 11a of the semiconductor substrate 11. The second semiconductor portion 3b and the active layer 5 constitute a semiconductor ridge portion 13 shown in FIG. 1. The semiconductor ridge portion 13 extends in the z-direction.

The semiconductor optical device 1 further comprises a contact layer 17 of the second conductive type, and electrodes 21 and 23. The contact layer 17 is made of III-V nitride mixed semiconductor, and is provided on the second conductive type semiconductor region 7. The electrode 21 is provided on the contact layer 17 and extends in a direction in which the semiconductor ridge portion 13 extends. The electrode 23 is provided on the backside 11b of the semiconductor substrate 11. The bandgap of the contact layer 17 is smaller than that of the second conductive type semiconductor region 7. Accordingly, the contact layer 17 and the electrode 21 can form an excellent ohmic contact therebetween.

Figure 3:
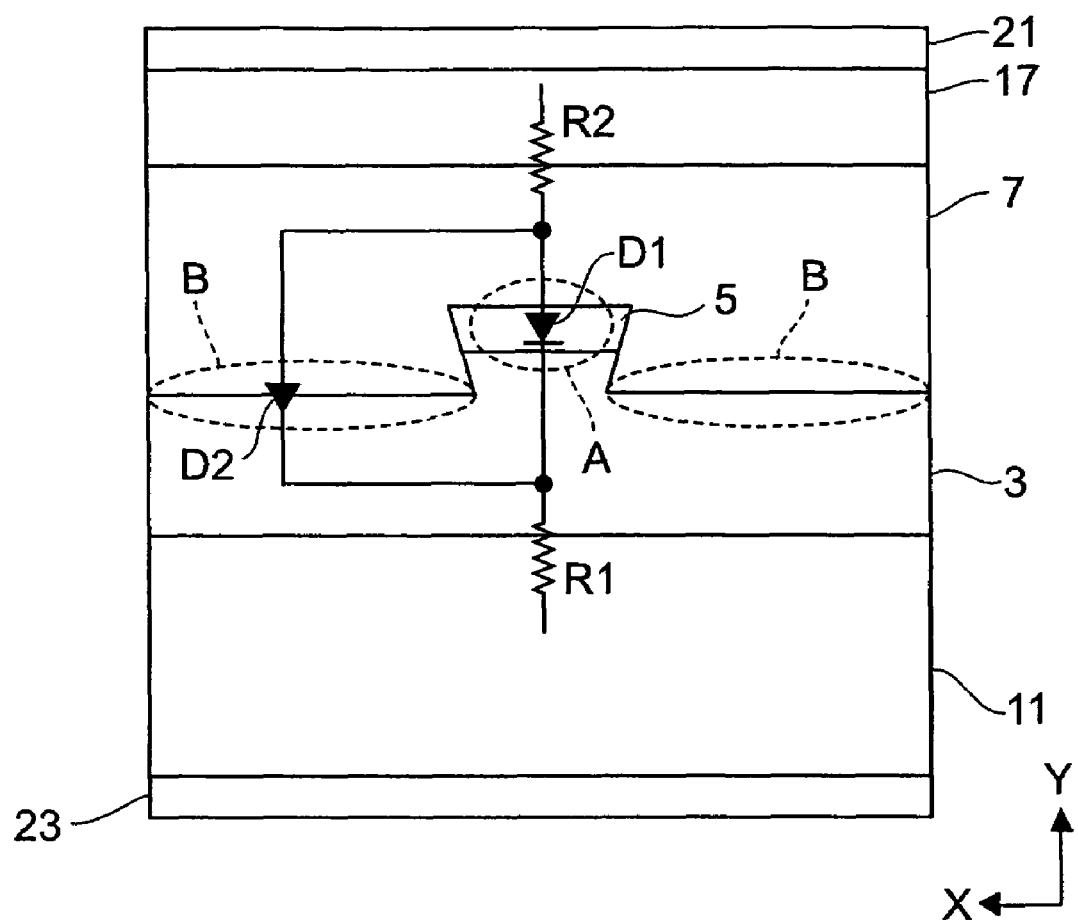
FIG. 3 is an equivalent circuit diagram showing the electrical property of the semiconductor optical device according to the first embodiment.

With reference to FIGS. 3 and 4, the operation of the semiconductor optical device 1 will be described. FIG. 3 is an equivalent circuit diagram showing the electrical property of the semiconductor optical device 1 according to the first embodiment. The pin junction ("A portion" in FIG. 3) constituted by the first conductive type semiconductor region 3, the active layer 5 and the second conductive type semiconductor region 7 and the pn junction ("B portion" in FIG. 3) constituted by the first conductive type semiconductor region 3 and the second conductive type semiconductor region 7 correspond to diodes D1 and D2, respectively, and these diodes are connected in parallel with each other in the equivalent circuit diagram. The resistor R1 in FIG. 3 corresponds to the equivalent resistance in the area of the first conductive type semiconductor region 3, the substrate 11 and the electrode 23, and the resistor R2 in FIG. 3 corresponds to the equivalent resistance in the area of the second conductive type semiconductor region 7, the contact layer 17 and the electrode 21. Since the bandgap energies of the first and second conductive type semiconductor regions 3 and 7 are greater than the bandgap energy of the active layer 5, the built-in potential of the pn junction in the B portion is greater than that of the pin junction in the A portion. Consequently, the pn junction in the B portion has a higher turn-on voltage and the pin junction in the A portion has a lower turn-on voltage. Therefore, when the driving voltage is between the turn-on voltages of the A portion and the B portion, only the A potion turns on and forward current flows exclusively through the A portion. Symbol R1 in FIG. 3 indicates an equivalent resistor in the first conductive type semiconductor region 3, and symbol R2 in FIG. 3 indicates an equivalent resistor in the second conductive type semiconductor region 7.

Area (a) in FIG. 4 shows a graph representing a relationship between the driving voltage and driving current of the semiconductor optical device 1. Area (b) in FIG. 4 shows a graph representing a relationship between the driving current and the optical output (I-L characteristics) of the semiconductor optical device 1. The turn-on voltage $V_A$ (shown in area (a) of FIG. 4) of the diode D1 is determined by the built-in potential in the A portion, and mainly depends on the bandgap energy of the active layer 5. The turn-on voltage $V_B$ of the diode D2 is determined by the built-in potential in the B portion, and mainly depends on the bandgap energies of the first and second conductive type semiconductor region 3 and 7. Since the built-in potential of the B portion is higher than that of the A portion, the turn-on voltage $V_B$ of the diode D2 is greater than the turn-on voltage $V_A$ of the diode D1. The greater the difference between the built-in potentials of the B portion and the A portion is, the greater the difference between the turn-on voltages $V_A$ and $V_B$ is. In other words, the greater the bandgap difference between the active layer 5 and the first and second conductive type semiconductor regions 3 and 7 is, the greater the difference between the turn-on voltages $V_A$ and $V_B$ is.

As shown in area (a) in FIG. 4, when a driving voltage is applied between the electrodes 21 and 23, the diode D1 turns on at the turn-on voltage $V_A$, whereby the resistance of the A portion is lowered and the forward current $I_A$ flows therethrough. Many carriers are supplied to the active layer 5 and these carriers are recombined to generate light. Since semiconductor lasers having normal values of cavity loss and internal loss start to oscillate at current slightly greater than current $I_A$, current $I_A$ is equivalent to the semiconductor laser threshold current. When the injected current exceeds the current $I_A$, the optical output power is rapidly increased. The diode D2 in the B portion does not turn on yet and the resistance in the B portion is still high. Therefore, the B portion functions as a current blocking region and thus the injected current is confined exclusively into the A portion (the active layer 5). Besides, since the refractive index of the active layer 5 is greater than the refractive indices of the first and second conductive type semiconductor regions 3 and 7, light generated in the active layer 5 is confined into the active layer 5 and its neighborhood. In this operation region (Region 1) in which the diode D1 turns on and the diode D2 does not turn on as described above, the current and the light are confined in the active layer strongly, leading to the following contributions: the effective stimulated emission is caused in the active layer to generate light; the threshold current is low; and the optical power increases in linearly proportion to the amount of the injected current.

When the applied voltage reaches the turn-on voltage $V_B$, the diode D2 turns on. Then, the resistance of the B portion becomes low and the applied current flows into the B portion in addition to the A portion, which increases leakage current that does not flow through the active layer 5. Therefore, when the driving current exceeds the current $I_B$ corresponding to the turn-on voltage $V_B$, the leakage current that does not contribute to the stimulated emission becomes large and thus the slope efficiency becomes low. As a result, the operation region in which the supplied current is greater than the current $I_B$ becomes an output saturation region (Region 2) in which the output power does not increase linearly with current and the relationship between the output power and the injected electrical power is nonlinear. If the linear relationship between the current and the output power is needed, then the semiconductor optical device 1 should be operated with the driving below $V_B$.

Figure 5:
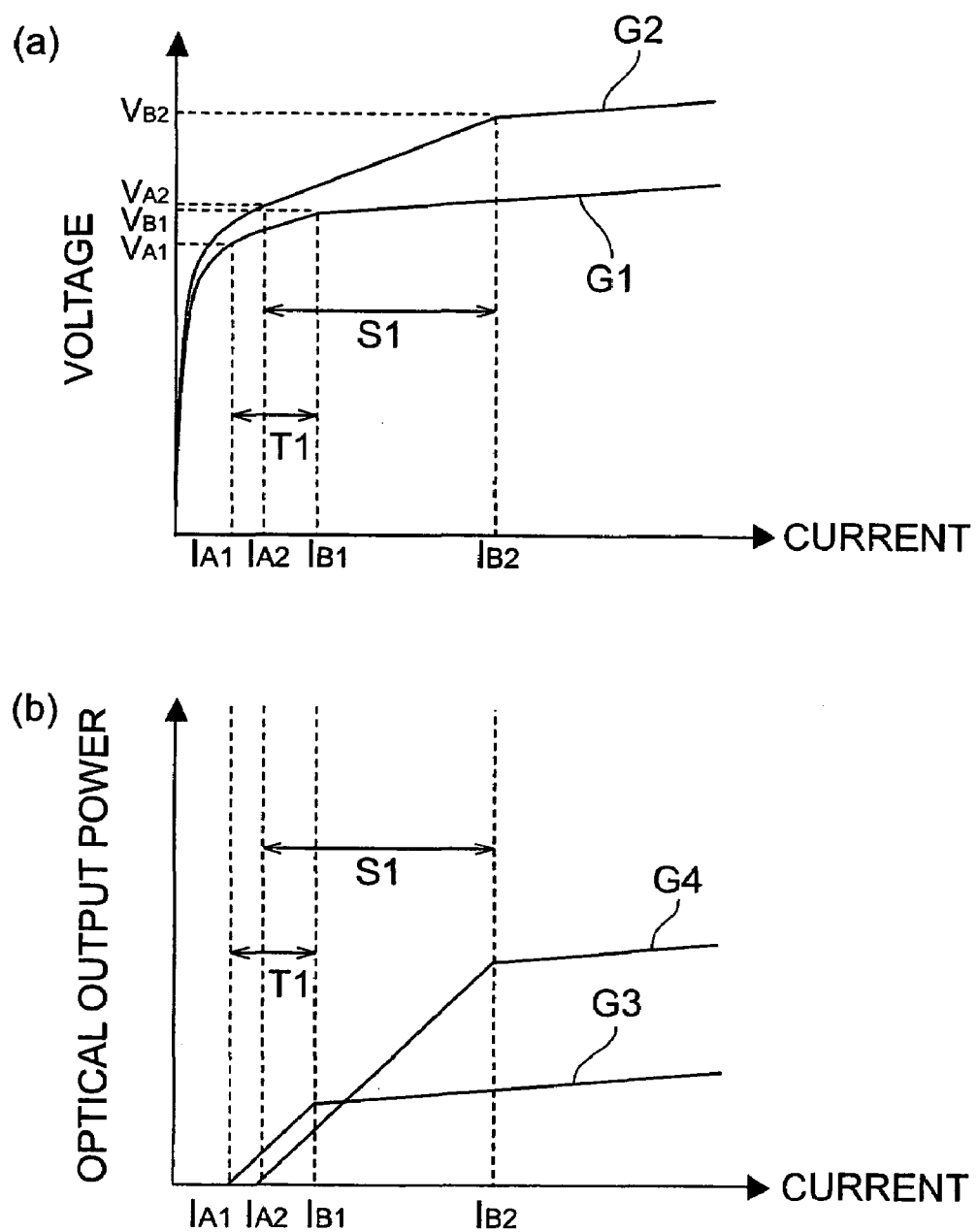
FIG. 5 is a schematic view for explaining dependence of the width of the linear operation region on the bandgap difference between the first and second conductive type semiconductor regions and the active layer for the semiconductor optical device according to the first embodiment.

Areas (a) and (b) in FIG. 5 show graphs for explaining dependence of the width of the linear operation region on the bandgap difference between the first and second conductive type semiconductor regions 3 and 7 and the active layer 5. Curve G1 in area (a) represents current vs. voltage characteristic in which the turn-on voltage in the A portion is $V_{A1}$ and the turn-on voltage in the B portion is $V_{B1}$. Curve G2 in area (a) represents current vs. voltage characteristics in which the turn-on voltage in the A portion is $V_{A2}$ and the turn-on voltage in the B portion is $V_{B2}$. In the graph in area (a), the following condition is satisfied: $V_{B2}-V_{A2}>V_{B1}-V_{A1}$. Curves G3 and G4 in area (b) represent the current vs. optical output power characteristics (I-L characteristics $V_B-V_A$) corresponding to the curve G1 and G2.

Curves G2 and G4 in areas (a) and (b) in FIG. 5 show that the linear operation region S1 defined by both current $I_{A2}$ corresponding to the turn-on voltage $V_{A2}$ and current $I_{B2}$ corresponding to the turn-on voltage $V_{B2}$ becomes wide if the bandgap difference (the turn-on voltage difference $V_B-V_A$) between the active layer 5 and the first and second conductive type semiconductor regions 3 and 7 is large. On the other hand, curves G1 and G3 show that the linear operation region T1 defined by both current $I_{A1}$ corresponding to the turn-on voltage $V_{A1}$ and current $I_{B1}$ corresponding to the turn-on voltage $V_{B1}$ becomes narrow if the bandgap difference (the turn-on voltage difference $V_B-V_A$) between the active layer 5 and the first and second conductive type semiconductor regions 3 and 7 is small. As the difference between the turn-on voltage $V_A$ and the turn-on voltage $V_B$ becomes larger, the linear operation region becomes wider. Accordingly, it is preferable that the bandgap difference between the active layer 5 and the first and second conductive type semiconductor regions 3 and 7 be large.

Furthermore, in the semiconductor laser having a large bandgap difference between the active layer and the cladding layers as above, since the pn junction outside the stripe region (B portion in FIG. 3) does not turn on till a large injection current level, the semiconductor laser has excellent linearity in current vs. optical output power (I-L) characteristics up to a high output region.

FIG. 10 shows a list for materials preferable for the semiconductor laser. The active layer is made, for example, of at least one of GaN, AlGaN, InGaN and InN. The cladding layers are made, for example, of AlGaN, GaN and InGaN can be used for the contact layer. The lattice constants of AlGaN and InGaN are substantial equal to or close to those of GaN, AlN and $ZrB_2$. Accordingly, if GaN substrates, AlN substrate, $ZrB_2$ substrates, GaN layers, AlN layers and $ZrB_2$ layers are used as the base for crystal growth, AlGaN and InGaN with excellent crystalline quality can be grown on the base because there is little lattice mismatch between the base and material grown thereon. AlGaN is a wide bandgap material having a bandgap energy of $5.4\times10^{-19}$ to $9.9\times10^{-19}$ Joule (3.4 to 6.2 eV). InGaN is material having a bandgap energy of $3.2\times10^{-19}$ to $5.4\times10^{-19}$ Joule (2 to 3.4 eV). As described above, AlGaN semiconductor has a bandgap energy of 6.2 eV at its maximum. Therefore, the bandgap difference between the active layer and the cladding layer becomes large if the cladding layer is made of AlGaN semiconductor, and thus the current vs. optical output characteristics (I-L characteristics) of the semiconductor laser maintain an excellent linearity up to a high output power operation region. Furthermore, since the bandgap difference between the active layer and the cladding layer is large, the carrier confinement in the active layer is enhanced and the confined carriers cannot be easily overflowed. As a result, the temperature characteristics of the semiconductor laser are improved, leading to an easy oscillation in a high temperature region, for example.

The materials listed in FIG. 10 is not limited to the semiconductor optical device according to the present embodiment and can be used for the semiconductor optical devices 51, 81 and 91 according to the second and third embodiments that will be explained below and other semiconductor optical devices according to the present invention. Therefore, also in the semiconductor optical devices in other embodiments, the temperature characteristics and linearity in the current vs. optical output characteristics as excellent as in the semiconductor optical device 1 can be obtained.

Figure 6:
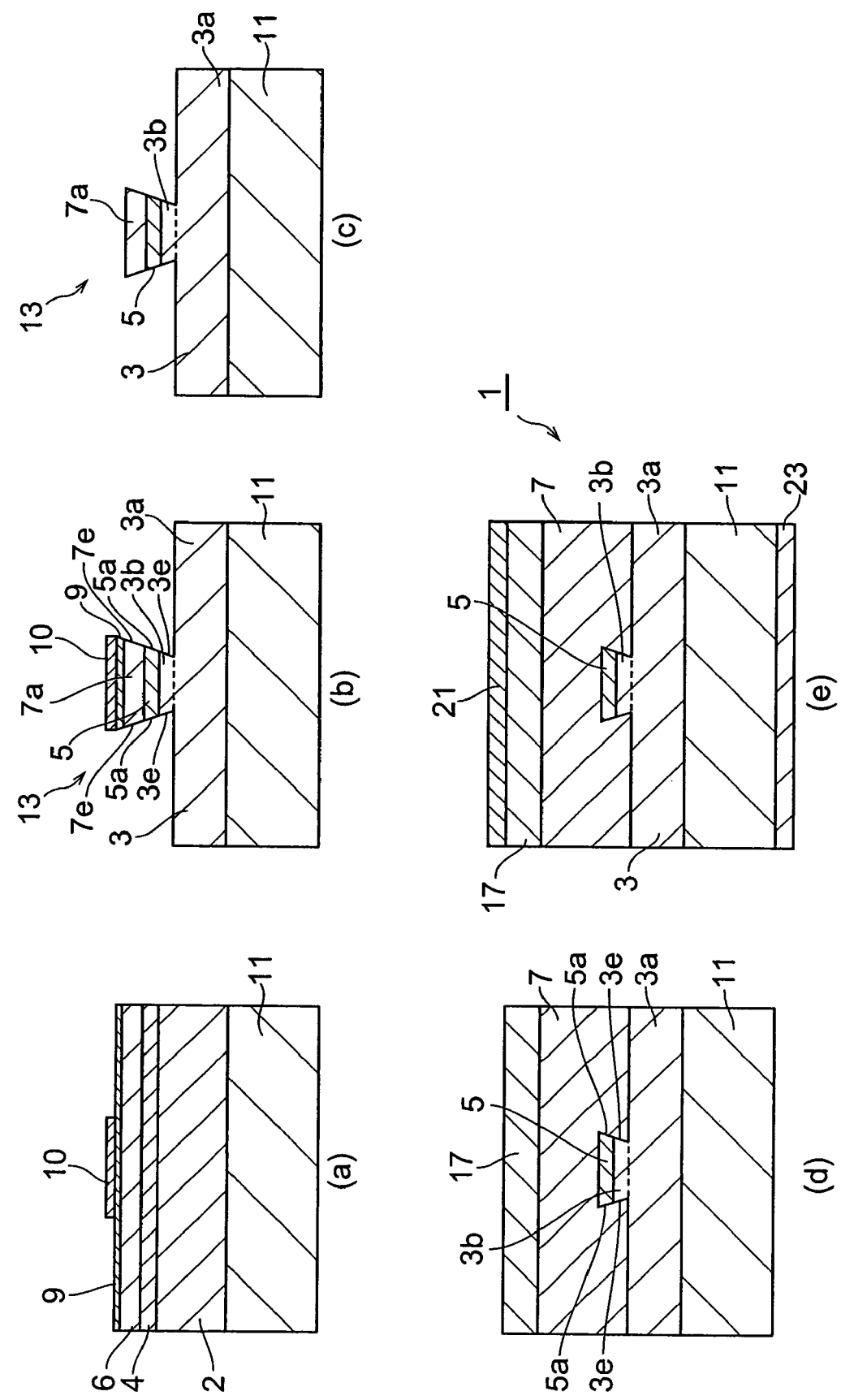
FIG. 6 is a view for explaining the fabrication of the semiconductor optical device.

With reference to FIG. 6, the fabrication of the semiconductor optical device 1 will be explained. The same reference symbols are used in order to facilitate the understanding of the following explanation. As shown in area (a) in FIG. 6, a first conductive type semiconductor layer 2, an active layer 4, a second conductive type semiconductor layer 6 and a protect layer 9 are grown on the semiconductor substrate 11 (the first crystal growth step). The above layers can be grown using Organo-Metallic Vapor Phase Epitaxy (OMVPE) method or Molecular Beam Epitaxy (MBE) method, for example. Then, an etching mask 10 is formed on the protect layer 9 to form a stripe-shaped semiconductor ridge portion 13. For example, the material of the etching mask 10 can be made of insulator, such as SiN or $SiO_2$.

As shown in area (b) of FIG. 6, the protect layer 9, the second conductive semiconductor layer 6, the active layer 4, the first conductive type semiconductor layer 2 are partially etched using the etching mask 10 by wet etching or dry etching to form the second conductive semiconductor layer 7a, the active layer 5 and the second semiconductor portion 3b of the first conductive type semiconductor region 3. After the etching, the sides 7e of the second conductive semiconductor layer 7a, the sides 5a of the active layer 5 and the sides 3e of the second semiconductor portion 3b of the first conductive type semiconductor region 3 are formed. The semiconductor ridge portion 13 includes the active layer 5 and the second semiconductor portion 3b. Area (b) in FIG. 6 shows the semiconductor ridge portion 13 that has an reverse mesa shape. If the crystal axis along which the mesa-stripe is formed and etchant therefor can be selected properly, then the etching is carried out to form another shape of the semiconductor ridge portion 13.

As shown in area (c) of FIG. 6, the etching mask 10 and protect layer 9 are removed. Then, as shown in area (d) of FIG. 6, the remaining portion of the second conductive type semiconductor region 7 and the contact layer 17 are grown thereon (the second crystal growth). The electrodes 21 and 23 are, finally, formed on the contact layer 17 and the backside of the semiconductor substrate 11, respectively, to complete the semiconductor optical device 1.

The semiconductor optical device 1 does not need the current block portion as used in buried heterostructure semiconductor lasers in FIG. 15. As seen from the foregoing explanation, the insulating mask for protecting the active layer is not needed in growing the semiconductor region for burying the active layer in the fabrication of the semiconductor optical device 1 according to the present embodiment. Therefore, there is no occurrence of the peeling off of the insulating mask in the fabrication of the optical semiconductor device 1 according to the present embodiment. Therefore, the fabrication of the optical semiconductor device 1 is much easier than that of the buried heterostructure semiconductor lasers shown in FIG. 15. As a result, the yield improvement and cost reduction can be realized in the semiconductor optical device 1. In addition, the number of the epitaxial growth steps is reduced (twice in the present embodiment) compared with the fabrication of buried heterostructure blue-light semiconductor lasers that needs three epitaxial growth steps as shown in FIG. 15. Therefore, according to the present embodiment, a simpler fabrication process is provided, leading to further yield improvement and cost reduction.

In the semiconductor optical device 1, the size of the contact layer 17 can be restricted and the restricted contact layer is located only on the part of the second conductive type semiconductor 7 provided above the active layer 5. In this modified structure, the distance between the restricted contact layer 17 and the pn junction (the B portion in FIG. 3) of the first and second conductive type semiconductor regions 3 and 7 is longer than the distance between the restricted contact layer 17 and the active layer 5. Accordingly, the resistance from the restricted contact layer 17 to the pn junction (the B portion in FIG. 3) is enhanced to increase the turn-on voltage $V_B$ of the pn junction (the B portion in FIG. 3). Consequently, the difference $V_A-V_B$ between the turn-on voltages $V_B$ and $V_A$ is increased and the carriers are confined to the active layer 5 even in a higher power region, thereby widening the linear operation region. Alternatively, the contact layer 17 has a stripe shape which extends on the active layer S.

In buried heterostructure semiconductor optical devices as shown in, for example, Publication 1, the injected carriers are blocked using the current blocking region having a pn junction constituted by a p-type semiconductor layer and an n-type semiconductor layer which are reversely biased. However, in this type of lasers, a plurality of pn junctions should be formed to realize a current blocking, which leads to a large parasitic capacitance, and prevents the high-speed operation of the buried heterostructure semiconductor optical devices. On the other hand, since the semiconductor optical device 1 according to the present embodiment blocks the injected carriers by use of the single pn junction, biased forwardly, constituted by the first and second conductive type semiconductor regions 3 and 7, only one pn junction is needed for current blocking and thus the capacitance is decreased. Therefore, the semiconductor optical device 1 can operate at higher speed.

The semiconductor optical device according to the present invention can be grown on a GaN substrate or a GaN layer, an AlN substrate or an AlN layer, or a $ZrB_2$ substrate or a $ZrB_2$ layer. Since AlGaN for the first and second conductive type semiconductor regions and AlGaN, GaN or InGaN for the active layer have lattice constants equal to or close to those of GaN, AlN and $ZrB_2$, crystalline defects due to the lattice-mismatch are not formed in the crystal growth step and thus excellent semiconductor crystal of AlGaN, GaN and InGaN can be grown.

FIG. 7 is a view showing a modified semiconductor optical device according to the present embodiment. Area (a) in FIG. 7 shows a cross sectional view. Area (b) in FIG. 7 shows a band diagram, taken along III-III in area (a), for the modified semiconductor optical device 1a. Area (c) in FIG. 7 shows a refractive index diagram, taken along III-III in area (a), for the modified semiconductor optical device 1a. The semiconductor optical device 1a further comprises a first optical confinement layer 25 and a second optical confinement layer 27. The first optical confinement layer 25 is provided between the first conductive type semiconductor region 3 and the active layer 5. The second optical confinement layer 27 is provided between the second conductive type semiconductor region 7 and the active layer 5. The second semiconductor portion 3b of the first conductive type semiconductor region 3, the active layer 5, the first optical confinement layer 25 and the second optical confinement layer 27 constitute a semiconductor ridge portion 13a.

The first optical confinement layer 25 is made of material having a bandgap energy between that of the first conductive type semiconductor region 3 and that of the active layer 5. The second optical confinement layer 27 is made of material having a bandgap energy between that of the second conductive type semiconductor region 7 and that of the active layer 5. Carriers are injected into the active layer 5 from the first and second conductive type semiconductor regions 3 and 7 through the first and second optical confinement layers 25 and 27. As shown in area (b) of FIG. 7, the injected carriers in the modified semiconductor optical device 1a are confined into the active layer 5 by the first and second optical confinement layers 25 and 27.

The first optical confinement layer 25 has a refractive index between that of the active layer 5 and that of the first conductive type semiconductor region 3. The second optical confinement layer 27 has a refractive index between that of the active layer 5 and that of the second conductive type semiconductor region 7. As shown in area (c) of FIG. 7, the first conductive type semiconductor region 3 and the second conductive type semiconductor region 7 confine light from the active layer 5 into the first and second optical confinement layers 25 and 27 and the active layer 5.

The first and second optical confinement layers 25 and 27 permit the current confinement and the optical confinement separately. These optical confinement layers enhance the confinement of the light into the active layer 5, leading to improvements of lasing characteristics, such as a threshold current reduction and a less dependence on temperature. If the active layer 5 has a quantum well structure constituted by thin films, the optical confinement factor is not great. But, by introducing the first and second optical confinement layers 25 and 27, the optical confinement factor of the quantum well structure increases significantly, thereby drastically improving the oscillation characteristics. As shown in FIG. 10, for example, AlGaN, GaN and InGaN semiconductors can be used as the material of the first and second optical confinement layers 25 and 27.

In order to confine light into the active layer 5, the refractive index of the first optical confinement layer 25 is between that of the active layer 5 and that of the first conductive type semiconductor region 3, and the refractive index of the second optical confinement layer 27 is between that of the active layer 5 and that of the second conductive type semiconductor region 7. The oscillating wavelength of light generated by the semiconductor laser is in the range of 400 nm to 1600 nm and the thickness values of the first and second optical confinement layers 25 and 27 should be thick sufficient to have effects on the confinement of the light. Accordingly, the thickness values of the first and second optical confinement layers 25 and 27 should be in the range of a few tens nanometers to a few hundreds nanometers. In order to inject carriers effectively into the active layer 5 through such relatively thick optical confinement layer 25 and 27, it is necessary that the first optical confinement layer 25 is made of material having a bandgap energy between that of the active layer 5 and that of the first conductive type semiconductor region 3 and the second optical confinement layer 27 is made of material having a bandgap energy between that of the active layer 5 and that of the second conductive type semiconductor region 7.

(Second Embodiment)

Figure 8:
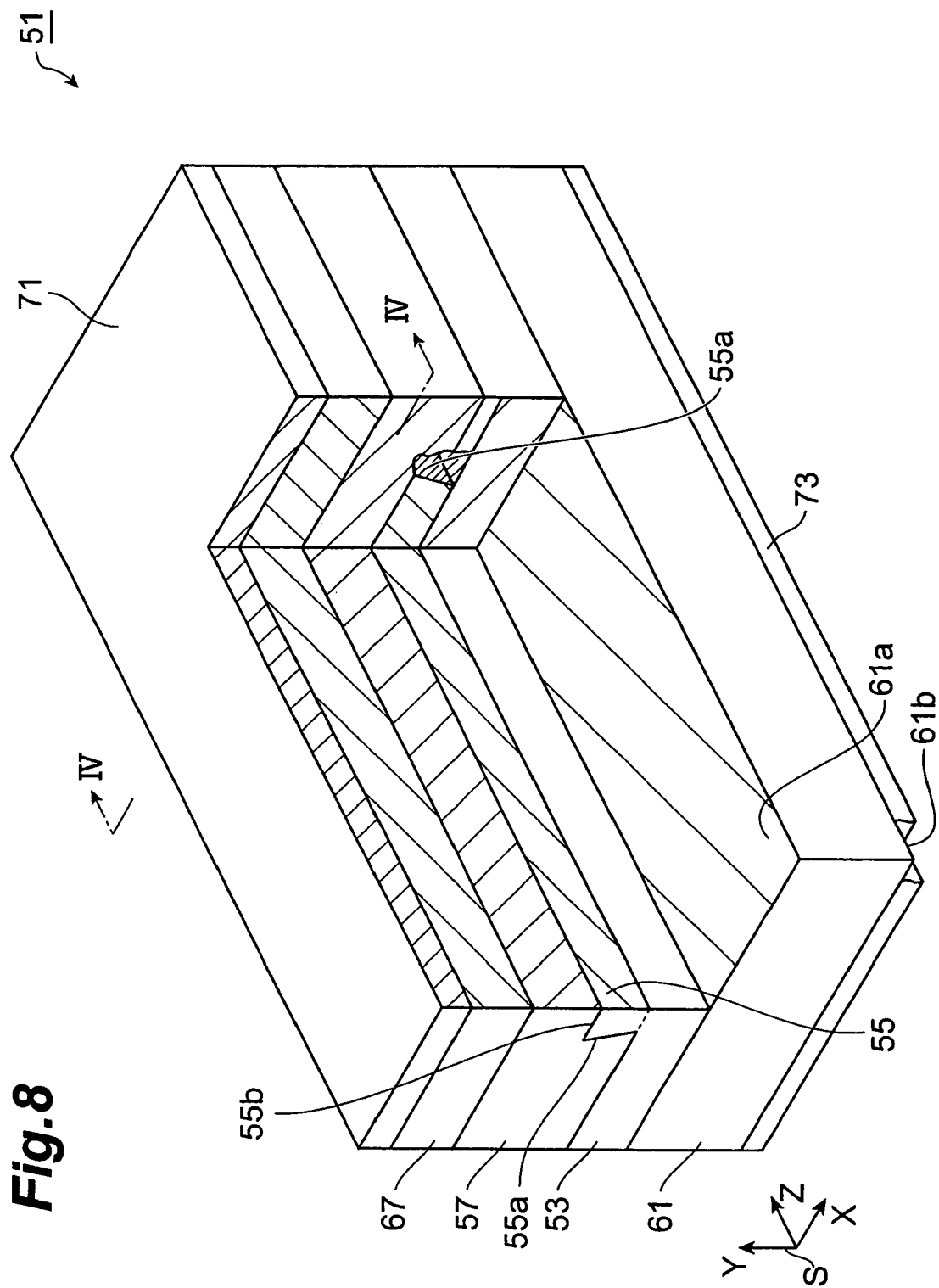
FIG. 8 is a perspective view showing a semiconductor optical device according to the second embodiment.

FIG. 8 is a perspective view showing a semiconductor optical device according to the second embodiment. An XYZ coordinate system S is depicted in FIG. 8. FIG. 9 is a view for the semiconductor optical device according to the second embodiment. Area (a) in FIG. 9 shows a cross sectional view taken along IV-IV in FIG. 8. Area (b) in FIG. 9 shows a band diagram, taken along V-V in area (a), for the semiconductor optical device according to the second embodiment. Area (c) in FIG. 9 shows a refractive index diagram, taken along V-V in area (a), for the semiconductor optical device according to the second embodiment. FIGS. 8 and 9 shows a semiconductor optical device 51, such as a semiconductor laser.

The semiconductor optical device 51 comprises a first conductive type semiconductor region 53, an active layer 55, and a second conductive type semiconductor region 57 the conductive type of which is different from that of first conductive type semiconductor region 53. The first conductive type semiconductor region 53 has first and second regions 53a and 53b as shown in FIG. 9. The first region 53a extends in the z-direction. The active layer 55 is provided on the first region 53a of the first conductive type semiconductor region 53. The active layer 55 has a pair of sides 55a. The second conductive type semiconductor region 57 is provided on the second region 53b of the first conductive type semiconductor region 53, and the sides 55a and top 55b of the active layer 55. The second region 57b of the second conductive type semiconductor region 57 and the second region 53b of the first conductive type semiconductor region 53 form a pn junction. The active layer 55 is made of III-V mixed nitride semiconductor. The active layer 55 is provided between the first region 57a of the second conductive type semiconductor region 57 and the first region 53a of the first conductive type semiconductor region 53.

The first conductive type semiconductor region 53 is made of III-V nitride mixed semiconductor, the bandgap of which is greater than that of the active layer 55 which is also made of III-V nitride mixed semiconductor. The second conductive type semiconductor region 57 is made of III-V nitride mixed semiconductor, the bandgap of which is greater than that of the active layer 55. As seen from the bandgap diagram shown in area (b) of FIG. 9, the first conductive type semiconductor region 53 and second conductive type semiconductor region 57 confine carriers to the active layer 55. Consequently, the first conductive type semiconductor region 53 works as a cladding layer of the first conductive type and the second conductive type semiconductor region 57 works as a cladding layer of the second conductive type. In the active layer 55, the confined carriers injected from the first conductive type semiconductor region 53 and the second conductive type semiconductor region 57 are recombined to generate light.

As shown in area (c) of FIG. 9, the refractive index of the first conductive type semiconductor region 53 is smaller than that of active layer 55. The refractive index of the second conductive type semiconductor region 57 is also smaller than that of active layer 55. Accordingly, the first conductive type semiconductor region 53 and the second conductive type semiconductor region 57 confine light from the active layer 55 in the active layer 55 in both x and y directions. Consequently, the first conductive type semiconductor region 53 and the second conductive type semiconductor region 57 act as optical cladding layers.

The structure of the active layer 55 may be the bulk structure of a single layer, the single quantum well structure of a single quantum well layer or the multiple quantum well structure of a plurality of well layers and barrier layers which are alternately arranged.

The semiconductor optical device 51 further comprises a substrate 61. For example, conductive substrates, such as GaN, SiC, Si, AlN, ZnO and $ZrB_2$ can be used as the substrate 61. On the primary surface 61a of the semiconductor substrate 61, the first conductive type semiconductor region 53 is provided.

The semiconductor optical device 51 further comprises a contact layer 67 of the second conductive type, and electrodes 71 and 73. The contact layer 67 is provided on the second conductive type semiconductor region 57. The electrode 71 is provided on the contact layer 67. The electrode 71 extends in a direction in which the active layer 55 extends. The electrode 73 is provided on the backside 61b of the semiconductor substrate 61. The contact layer 67 is made of III-V nitride mixed semiconductor. The bandgap of the contact layer 67 is smaller than that of the second conductive type semiconductor region 57. Accordingly, the contact layer 67 and the electrode 71 can form an excellent ohmic contact therebetween.

In the semiconductor optical device 51, since the first conductive type semiconductor region 53 and the second conductive type semiconductor region 57 each has a bandgap energy greater than that of the bandgap of the active layer 55, the built-in potential of the pn junction constituted by the first conductive type semiconductor region 53 and the second conductive type semiconductor region 57 is greater than that of the pin junction constituted by the first conductive type semiconductor region 53, the active layer 55 and the second conductive type semiconductor region 57. Therefore, the semiconductor optical device 51 has the same equivalent circuit as in FIG. 3 and operates in the same manner as the semiconductor optical device 1. Namely, carriers in the first conductive type semiconductor region 53 and the second conductive type semiconductor region 57 are blocked by the pn junction constituted by the first conductive type semiconductor region 53 and the second conductive type semiconductor region 57, and are exclusively injected and confined into the active layer 55. Thus, the semiconductor optical device 51 is effective in confining the carriers into the active layer 55.

The method of fabricating the semiconductor optical device 51 is different from the method of fabricating the semiconductor optical device 1 (FIG. 6) in the following points: the method of fabricating the semiconductor optical device 51 does not include the etching of the first conductive type semiconductor region 53 in the etching process shown in area (b) of FIG. 6. This method does not include the growth of current block portion (as shown in area (c) in FIG. 15) and thus the insulating mask for protecting the active layer 55 is not needed in growing a semiconductor region for burying the active layer 55. Accordingly, there is no occurrence of the peeling off of the insulating mask that may be caused in the fabrication of buried heterostructure blue-light semiconductor laser. Therefore, according to the present embodiment, a semiconductor laser having the same performance as that of the buried hetero-structure semiconductor laser shown in Publication 1 can be realized using a much easier fabrication process, leading to a significant yield improvement and cost reduction.

In a modified structure of the semiconductor optical device 51, the size of the contact layer 67 can be restricted and the restricted contact layer is located only on the part of the second conductive type semiconductor 57 provided above the active layer 55. In the modified structure, the distance between the restricted contact layer 67 and the pn junction (the B portion in FIG. 3) of the first and second conductive type semiconductor regions 53 and 57 is longer than the distance between the restricted contact layer 67 and the active layer 55. Accordingly, the resistance from the restricted contact layer 67 to the pn junction (the B portion in FIG. 3) is enlarged to increase the turn-on voltage $V_B$ of the pn junction (the B portion in FIG. 3). Consequently, since the difference $V_B-V_A$ between the turn-on voltages $V_B$ and $V_A$ is increased and the carriers are confined to the active layer 55 up to a higher power region, the linear operation region is widened.

Since the semiconductor optical device 51 according to the present embodiment blocks the injected carriers by use of the single pn junction which is biased forwardly and is constituted by the first and second conductive type semiconductor regions 53 and 57, only one pn junction is needed for current blocking, so that the capacitance is decreased as compared with the buried heterostructure semiconductor optical devices as in publication 1 in which a plurality of pn junctions in the current block portion are needed for current blocking. Therefore, the semiconductor optical device 51 can operate at high speed.

The semiconductor optical device according to the present invention can be grown on a GaN substrate or a GaN layer, an AlN substrate or an AlN layer, or a $ZrB_2$ substrate or a $ZrB_2$ layer. Since AlGaN for the first and second conductive type semiconductor regions and AlGaN, GaN or InGaN for the active layer have lattice constants equal to or close to those of GaN, AlN and $ZrB_2$, crystalline defects due to the lattice mismatch are not formed in the crystal growth step and thus excellent semiconductor crystal of AlGaN, GaN and InGaN can be grown.

The materials lised in FIG. 10 can be used for the layers in the semiconductor optical device 51 according to the present invention. By use of these materials, the temperature characteristics and linearity in the current vs. optical output characteristics (I-L characteristics) become excellent as in the semiconductor optical device 1.

FIG. 11 is a view showing another modified semiconductor optical device. Area (a) in FIG. 11 shows a cross sectional view. Area (b) in FIG. 11 shows a band diagram, taken along VI-VI in area (a), for the semiconductor optical device according to this embodiment. Area (c) in FIG. 11 shows a refractive index diagram, taken along VI-VI in area (a), for the semiconductor optical device according to the present embodiment. A semiconductor optical device 51a includes first and second optical confinement layers 75 and 77. The first optical confinement layer 75 is provided between the active layer 55 and the first conductive type semiconductor region 53 and the second optical confinement layer 77 is provided between the active layer 55 and the second conductive type semiconductor region 57. The active layer 55 and the first and second optical confinement layers 75 and 77 constitute a semiconductor ridge portion 63a.

The first and second optical confinement layers 75 and 77 have the same structure and functions as the first and second optical confinement layers 25 and 27 described in the first embodiment. The first optical confinement layer 75 is made of material having a bandgap energy between that of the first conductive type semiconductor layer 53 and that of the active layer 55. The second optical confinement layer 77 is made of material having a bandgap energy between that of the second conductive type semiconductor layer 57 and that of the active layer 55. As shown in area (c) of FIG. 11, the first optical confinement layer 75 has a refractive index between that of the active layer 55 and that of the first conductive type semiconductor layer 53, and the second optical confinement layer 77 has a refractive index between that of the active layer 55 and that of the second conductive type semiconductor layer 57. Therefore, the first and second optical confinement layers 75 and 77 permit the current confinement and the optical confinement into the active layer 55 separately. These optical confinement layers 75, 77 enhance the confinement of the light into the active layer 55, which leads to the improvements of the lasing characteristics, such as a threshold current reduction and a less dependence on temperature. In one example, AlGaN, GaN and InGaN can be used for the optical confinement layers as shown in FIG. 10.

Figure 12:
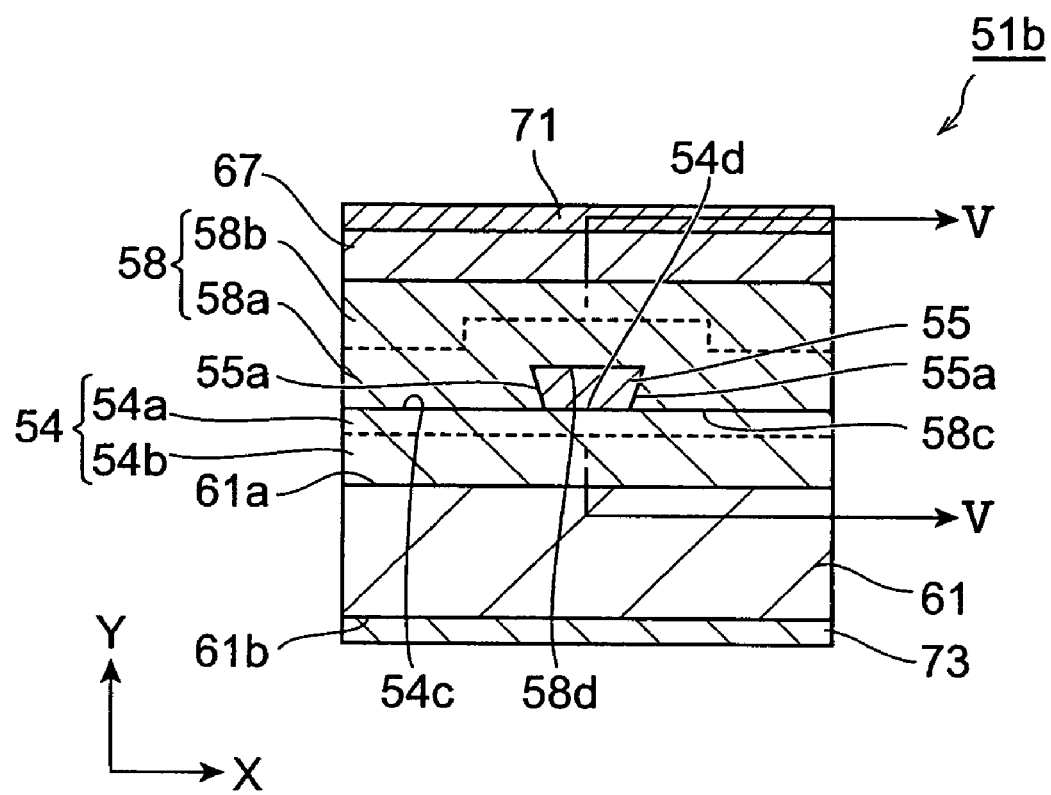
FIG. 12 is a cross sectional view showing still another modified semiconductor optical device.

FIG. 12 is a cross sectional view showing still another modified semiconductor optical device. In this modified semiconductor optical device, the first conductive type semiconductor region 54 has a third region 54a and another region 54b. The second conductive type semiconductor region 58 has a fourth region 58a and another region 58b. The third region 54a of the first conductive type semiconductor region 54 has an interfacial region 54c on which the second conductive type semiconductor region 58 is provided, and an interfacial region 54d on which the active layer 55 is provided. The fourth region 58a of the second conductive type semiconductor region 58 has an interfacial region 58c on which the first conductive type semiconductor region 54 is provided and an interfacial region 58d on which the active layer 55 is provided. In the first conductive type semiconductor region 54, the dopant concentration of the third region 54a is different from that of the other region 54b. In the second conductive type semiconductor region 58, the dopant concentration of the fourth region 58a is different from that of the other region 58b.

FIG. 13 schematically shows the current vs. voltage and the current vs. optical output power characteristics for the semiconductor optical device 51b. Curve G5 in area (a) in FIG. 13 indicates a current vs. voltage relationship of the semiconductor optical device 51b in which the regions 54a and 58a are heavily doped. Curve G6 in area (a) in FIG. 13 indicates a current vs. voltage relationship of the semiconductor optical device 51b that does not have the third and the fourth regions 54a and 58a doped heavily. Curves G7 and G8 in area (b) in FIG. 16 indicate current vs. optical power characteristics that correspond to curves G5 and G6, respectively. In the semiconductor optical device 51b, by changing the dopant concentrations of the third region 54a and the fourth region 58a independent of the other regions 54b and 58b, the quasi-Fermi levels and resistance values of the third region 54a and fourth region 58a can be changed. Due to these changes, the turn-on voltages of the following portions are changed accordingly: (1) the pn junction constituted by the first conductive type semiconductor region 54 and the second conductive type semiconductor region 58 (B portion in FIG. 3); (2) the pin junction constituted by the first conductive type semiconductor region 54, the active region 55 and the second conductive type semiconductor region 58 (A portion in FIG. 3). Furthermore, the series resistance of the semiconductor optical device 51b is also changed in the linear operation region which appears after turning on the pin junction portion.

For example, if the third region 54a and fourth region 58a are doped more heavily than the regions 54b and 58b, the resistance of these cladding parts becomes low, whereby the turn-on voltages of the pn junction (B portion in FIG. 3) and pin junction (A portion in FIG. 3) are lowered. As a result, as shown in areas (a) and (b) of FIG. 13, the turn-on voltage $V_{A2}$ of the pin junction portion is changed to a lower turn-on voltage $V_{A3}$ and the turn-on voltage $V_{B2}$ of the pn junction portion is changed to a lower turn-on voltage $V_{B3}$. Furthermore, since the resistance values of the third region 54a and fourth region 58a are also lowered, the slope of curve of the current vs. voltage relationship (series resistance) becomes smaller in the linear operation region after turning on the pin junction portion. Consequently, since the current at which the pn junction portion is turned on is increased from current $I_{B2}$ to $I_{B3}$, the width of the linear operation region in the current vs. optical power relationship is enlarged, thereby increasing the optical output power.

As described in above, the turn-on voltages and the above series resistance values can be changed by changing the dopant concentrations of the regions 54a and 58a, so that the range of the linear operation region can be changed suitably depending on the use of the semiconductor optical device 51b. In the above example, although the dopant concentrations of both of the regions 54a and 58a are changed, the dopant concentration of only one of the regions 54a and 58a may be changed, thereby providing similar advantages as above.

The turn-on voltages as above can be also changed by the change of the dopant concentration of the entire first conductive type semiconductor region 54 (and/or the entire second conductive type semiconductor region 58). Besides, the turn-on voltages can be also changed by changing the dopant concentration of only one of the first conductive type semiconductor region 54 and the second conductive type semiconductor region 58. In the above example of the optical device, dopant concentration changes are performed in only necessary parts of the first conductive type semiconductor region 54 and/or the second conductive type semiconductor region 58. This is preferable for minimizing the change of other device characteristics caused by the dopant concentration change.

The control method of the turning-on voltages by changing dopant concentrations of parts or the whole of the first conductive type semiconductor region and the second conductive type semiconductor region can be applied to the semiconductor optical device 1 in the first embodiment, the semiconductor optical device 51b in the present embodiment and other semiconductor optical device according to the present invention.

FIG. 14 shows semiconductor optical devices according to the third embodiment. Area (a) of FIG. 14 shows one example of the third embodiment and area (b) of FIG. 14 shows another example of the third embodiment. With reference to area (a), a semiconductor optical device 81, such as a semiconductor laser, is shown. The semiconductor optical device 81 is provided on the substrate 89. Both conductive substrates and insulating substrates can be used as the substrate 89. The semiconductor optical device 81 has a structure similar to that of the semiconductor optical device 1, and includes a first conductive type semiconductor region 83, an active layer 85 and a second conductive type semiconductor region 87. The first conductive type semiconductor region 83 is provided on the substrate 89, and has a first region 83e on which an electrode 23a is provided, and a second region 83f on which the active layer 85 and the second conductive type semiconductor region 87 are provided. The first region 83e and the second region 83f are arranged along a predetermined axis. The second region 83f has a first semiconductor portion 83a and a second semiconductor portion 83b. The first semiconductor portion 83a has a first region 83c and a second region 83d which are arranged along a predetermined plane. The second semiconductor portion 83b is located on the first region 83c. The active layer 85 is provided between the second semiconductor portion 83b and the second conductive type semiconductor region 87. On the second conductive type semiconductor region 87, a contact layer 17a is provided, and on the contact layer 17a, an electrode 21a is provided. The first conductive type semiconductor region 83 is made of III-V nitride semiconductor mixed crystal, and the bandgap energy of this III-V nitride mixed semiconductor crystal is greater than that of the active layer 85 which is also made of III-V nitride mixed semiconductor crystal. The second conductive type semiconductor region 87 is made of III-V nitride mixed semiconductor crystal, and the bandgap energy of this III-V nitride mixed semiconductor crystal is greater than that of the active layer 85. Current from electrode 21a flows through the active layer 85, the first conductive type semiconductor region 83f and 83e to the electrode 23a. The semiconductor optical device 81 has the same advantages and the technical contributions as the semiconductor optical device 1.

With reference to area (b) of FIG. 14, a semiconductor optical device 91, such as a semiconductor laser, is shown. The semiconductor optical device 91 is provided on the substrate 89. Both conductive substrates and insulating substrates are used as the substrate 89. The semiconductor optical device 91 has a structure similar to that of the semiconductor optical device 51, and includes a first conductive type semiconductor region 93, an active layer 95 and a second conductive type semiconductor region 97. The first conductive type semiconductor region 93 is provided on the substrate 89, and has a first region 93e on which an electrode 23b is provided, and a second region 93f on which the active layer 95 and the second conductive type semiconductor region 97 are provided. The first region 93e and the second region 93f are arranged along the surface of the substrate 89. The second region 93f has a first region 93c and a second region 93d which are arranged along the surface of the substrate 89. The active layer 95 is provided between the first region 93c and the second conductive type semiconductor region 97. On the second conductive type semiconductor region 97, a contact layer 17b is provided, and on the contact layer 17b, an electrode 21b is provided. The first conductive type semiconductor region 93 is made of III-V nitride mixed semiconductor crystal, and the bandgap energy of this III-V nitride mixed semiconductor crystal is greater than that of the active layer 95 which is also made of III-V nitride mixed semiconductor crystal. The second conductive type semiconductor region 97 is made of III-V nitride mixed semiconductor crystal, and the bandgap energy of this III-V nitride mixed semiconductor crystal is greater than that of the active layer 95. Current from electrode 21b flows through the active layer 95, the first conductive type semiconductor region 93f and 93e to the electrode 23b. The semiconductor optical device 91 has the same advantages and technical contributions as the semiconductor optical device 51. In the semiconductor optical devices 81 and 91, GaN, SiC, $Al_2O_3$, AlN and $MgAl_2O_4$ can be used as the insulating substrates, and GaN, SiC, Si, AlN, ZnO and $ZrB_2$ can be used for the conductive substrates. GaN, SiC and AlN can be used for both of the insulating substrates and the conductive substrates because these materials exhibit conduction or insulation depending on the doping conditions.

In the semiconductor optical devices 81 and 91, if required, optical confinement layers can be used and provided on both sides of the active layer. Furthermore, the contact layer is located only above the active layer. Improvements provided by the above modifications are the same as those in the first and second embodiments.

In the first to third embodiments, substrates such as GaN, SiC, $Al_2O_3$, Si, AlN, ZnO, $MgAl_2O_4$ and $ZrB_2$ are used as base crystal for crystal growth. However, the base crystal is not limited to substrates, but it can be provided by a semiconductor layer grown on substrates of a different material. In this configuration, a wider range of materials can be used for the substrate, which increases flexibilities in the structure design and fabrication process of the semiconductor optical device.

In the semiconductor optical devices in the embodiments, the insulating mask for protecting the active layer is not needed in growing a semiconductor region burying the active layer. Therefore, there is no occurrence of the peeling-off of the mask in the fabrication of buried heterostructure blue-light lasers, and the semiconductor optical devices in the embodiments can be fabricated using much easier process as compared with buried heterostructure semiconductor lasers, leading to the yield improvement and the cost reduction. In addition, because the fabrication of the semiconductor optical devices in the embodiments needs only two crystal growth steps, the fabrication process becomes simpler than that of buried heterostructure semiconductor lasers that needs three crystal growth steps, which contributes to further yield improvement and cost reduction.

While the semiconductor blue-light optical devices in the past had a ridge-waveguide structure, the semiconductor blue-light optical devices in the embodiments have structures (hereinafter referred to as "band gap difference (BGD) structure") that are equivalent to those of the conventional buried heterostructure semiconductor lasers. Accordingly, semiconductor optical devices of the BGD structure are superior to the above ridge type structure, and have the following advantages.

Since the active layer of the ridge structure is not restricted by a current block portion, carriers injected into the active layer leak significantly in the lateral directions. Thus, a large part of the injected carriers does not interact with photons (i.e., does not contribute to the stimulated emission) and is not utilized to generate light. On the other hand, the active layer of in the BGD structure is provided only in the stripe region and most of the injected carriers are confined into the active layer by the hetero-barriers between the active layer and the current blocking layer. Therefore, the leak carriers in the lateral direction become much smaller compared with ridge structures which enhances the stimulated emission. Therefore, the improvements of oscillation characteristics, such as the threshold current reduction and increase of optical output power, can be obtained.

In the ridge structure, since the optical confinement in the lateral direction is weaker than that in the vertical direction, waveguide modes at the facet spread more widely in the lateral direction than in the vertical direction. Consequently, the radiation angle of the far field pattern (FFP) in the horizontal direction is much narrower than that in the vertical direction. Accordingly, the cross section of the beam outputted from the ridge structure device is elliptical and thus the reshaping of the beam using a dedicated lens is needed to narrow down the size of the beam to a fine spot size nearly equal to the wavelength. This leads to a considerable cost increase because of the complicated lens system is needed for reshaping an elliptical beam. On the other hand, in the BGD structure, the optical confinement in the lateral direction becomes as strong as that in the vertical direction due to the refractive-index difference between the active layer and the cladding layer. As a result, the radiation angle of the far field pattern (FFP) in the horizontal direction can be sufficiently enlarged, and therefore the difference of the radiation angle between in the horizontal direction and in the vertical direction is small. Therefore, the cross section of the beam becomes nearly circular. Consequently, the beam is narrowed down to the fine size without the reshaping of the beam, whereby a much simpler lens system can be used, leading to a significant cost reduction. This is a great advantage when the semiconductor laser according to the present embodiment is used as light sources for optical recoding mediums, such as digital versatile disks (DVDs) and compact disks (CDs).

While the current is confined using insulator with a poor thermal conductivity in the ridge structure, the current is confined using semiconductor with a good thermal conductivity in the BGD structure. Accordingly, the heat radiation in the BGD structure is larger than that in the ridge structure. Therefore, the thermal stress is lowered and the performances and reliability of the semiconductor laser are improved in the BGD structure.

Since the surface of the semiconductor laser with the ridge structure is not flat, the semiconductor laser cannot be mounted in the junction-down configuration. Conversely, since the surface of the semiconductor laser with the BGD structure is made flat, the semiconductor laser can be easily mounted in a junction-down configuration. The semiconductor laser mounted in this configuration exhibits a good heat radiation and the thermal stress is lowered. Therefore, by mounting the semiconductor laser with the BGD structure in the junction-down configuration, the performances and reliability of the semiconductor laser are further improved.

Having described and illustrated the principle of the invention in a preferred embodiment thereof, it is appreciated by those having skill in the art that the invention can be modified in arrangement and detail without departing from such principles. For example, the semiconductor optical device encompasses not only semiconductor lasers, but also semiconductor light-emitting diodes, semiconductor optical amplifiers, semiconductor electro-absorption modulators, semiconductor optical wave guide, semiconductor optical integrated devices and the like, as well as integrated devices integrating these devices. The present invention provides any one of these devices with enhanced carrier confinement into the active layer by the hetero-structure, the improvement of the oscillating characteristics and temperature characteristics. Details of structures of these devices can be modified as necessary. Furthermore, the part or the whole of the contact layer extends along the active layer to form the stripe of the contact layer. We therefore claim all modifications and variations coming within the spirit and scope of the following claims.

What is claimed is:

1. A semiconductor optical device comprising:
a first conductive type semiconductor region including a first semiconductor portion and a second semiconductor portion, the first and second semiconductor portions being made of nitride mixed semiconductor crystal, the first semiconductor portion having a first region and a second region, the first and second regions being arranged along a predetermined plane, the second semiconductor portion being provided on the first region of the first semiconductor portion, the second semiconductor portion having a side;
a second conductive type semiconductor region made of nitride mixed semiconductor crystal, the second conductive type semiconductor region including a first region and a second region, the first region being different from the second region, the second region of the first conductive type semiconductor region and the second region of the second conductive type semiconductor region constituting a pn junction, the sides of the second semiconductor portion and the second region of the second conductive type semiconductor region constituting a pn junction; and
an active layer made of nitride mixed semiconductor crystal, the active layer being provided between the second semiconductor portions of the first conductive type semiconductor region and the first region of the second conductive type semiconductor region, a bandgap energy of the first conductive type semiconductor region being greater than that of the active layer, a bandgap energy of the second conductive type semiconductor region being greater than that of the active layer.

2. The semiconductor optical device according to claim 1, further comprising a substrate having a surface, the first conductive type semiconductor region, the second conductive type semiconductor region and the active layer being grown on the surface of the substrate, the surface of the substrate being made of one of GaN, SiC, $Al_2O_3$, Si, AlN, ZnO, $MgAl_2O_4$, and $ZrB_2$.

3. The semiconductor optical device according to claim 1, wherein the first conductive type semiconductor region is made of $Al_XGa_{1-X}N$ semiconductor (0<X<1), the second conductive type semiconductor region is made of $Al_YGa_{1-Y}N$ semiconductor (0<Y<1), and the active layer is made of at least one of $In_ZGa_{1-Z}N$ semiconductor (0<Z<1), $Al_SGa_{1-S}N$ semiconductor (0<S<1), GaN semiconductor and InN semiconductor.

4. The semiconductor optical device according to claim 1, further comprising a second conductive type contact layer provided on the active layer and the second conductive type semiconductor region, the second conductive type contact layer being made of nitride mixed semiconductor crystal.

5. The semiconductor optical device according to claim 1, wherein the first conductive type semiconductor region includes a third region and a fourth region, the third region and the second conductive type semiconductor region constitute the pn junction, and a dopant concentration of the third region is different from that of the fourth region.

6. The semiconductor optical device according to claim 1, wherein the second conductive type semiconductor region includes a third region and a fourth region, the third region and the first conductive type semiconductor region constitute the pn junction, and a dopant concentration of the third region is different from that of the fourth region.

7. The semiconductor optical device according to claim 1, further comprising:
a first optical confinement layer provided between the active layer and the first conductive type semiconductor region; and
a second optical confinement layer provided between the active layer and the second conductive type semiconductor region.

8. The semiconductor optical device according to claim 1, wherein the semiconductor optical device includes at least one of a semiconductor laser, a light emitting diode, a semiconductor optical amplifier, an electro-absorption type modulator and a semiconductor optical waveguide.

9. A semiconductor optical device comprising:
a first conductive type semiconductor region having a first region and a second region, the first conductive type semiconductor region being made of nitride mixed semiconductor crystal, the first and second regions arranged along a predetermined plane;
a second conductive type semiconductor region including a first region and a second region, the second conductive type semiconductor region being made of nitride mixed semiconductor crystal, the first region being different from the second region, the second region of the second conductive type semiconductor region and the second region of the first conductive type semiconductor region constituting a pn junction; and an active layer provided between the first region of the first conductive type semiconductor region and the first region of the second conductive type semiconductor region, the active layer being made of nitride mixed semiconductor crystal, a bandgap energy of the first conductive type semiconductor region being greater than that of the active layer, a bandgap energy of the second conductive type semiconductor region being greater than that of the active layer.

10. The semiconductor optical device according to claim 9, further comprising a substrate having a surface, the first conductive type semiconductor region, the second conductive type semiconductor region and the active layer being grown on the surface of the substrate, the surface of the substrate being made of one of GaN, SiC, $Al_2O_3$, Si, AlN, ZnO, $MgAl_2O_4$, and $ZrB_2$.

11. The semiconductor optical device according to claim 9, wherein the first conductive type semiconductor region is made of $Al_XGa_{1-X}N$ semiconductor (0<X<1), the second conductive type semiconductor region is made of $Al_YGa_{1-Y}N$ semiconductor (0<Y<1), and the active layer is made of at least one of $In_ZGa_{1-Z}N$ semiconductor (0<Z<1), $Al_SGa_{1-S}N$ semiconductor (0<S<1), GaN semiconductor and InN semiconductor.

12. The semiconductor optical device according to claim 9, further comprising a second conductive type contact layer provided on the active layer and the second conductive type semiconductor region, the second conductive type contact layer being made of nitride mixed semiconductor crystal.

13. The semiconductor optical device according to claim 9, wherein the first conductive type semiconductor region includes a third region and a fourth region, the third region and the second conductive type semiconductor region constitute the pn junction, and a dopant concentration of the third region is different from that of the fourth region.

14. The semiconductor optical device according to claim 9, wherein the second conductive type semiconductor region includes a third region and a fourth region, the third region and the first conductive type semiconductor region constitute the pn junction, and a dopant concentration of the third region is different from that of the fourth region.

15. The semiconductor optical device according to claim 9, further comprising:

a first optical confinement layer provided between the active layer and the first conductive type semiconductor region; and a second optical confinement layer provided between the active layer and the second conductive type semiconductor region.

16. The semiconductor optical device according to claim 9, wherein the semiconductor optical device includes at least one of a semiconductor laser, a light emitting diode, a semiconductor optical amplifier, an electro-absorption type modulator and a semiconductor optical waveguide.

* * * * *